United States Patent
Kitazumi et al.

(10) Patent No.: US 11,521,912 B2
(45) Date of Patent: Dec. 6, 2022

(54) ELECTRONIC ELEMENT MOUNTING SUBSTRATE, ELECTRONIC DEVICE, AND ELECTRONIC MODULE

(71) Applicant: KYOCERA Corporation, Kyoto (JP)

(72) Inventors: Noboru Kitazumi, Kyoto (JP); Yousuke Moriyama, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 161 days.

(21) Appl. No.: 17/254,887

(22) PCT Filed: Jun. 27, 2019

(86) PCT No.: PCT/JP2019/025658
§ 371 (c)(1),
(2) Date: Dec. 22, 2020

(87) PCT Pub. No.: WO2020/004567
PCT Pub. Date: Jan. 2, 2020

(65) Prior Publication Data
US 2021/0210408 A1    Jul. 8, 2021

(30) Foreign Application Priority Data

Jun. 27, 2018 (JP) .............................. JP2018-122143
Jun. 27, 2018 (JP) .............................. JP2018-122144
(Continued)

(51) Int. Cl.
*H05K 1/02* (2006.01)
*H01L 23/373* (2006.01)
(Continued)

(52) U.S. Cl.
CPC .......... *H01L 23/3735* (2013.01); *H01L 23/13* (2013.01); *H01L 23/49838* (2013.01);
(Continued)

(58) Field of Classification Search
CPC ..... H05K 1/0204; H05K 1/0306; H05K 7/205
See application file for complete search history.

(56) References Cited

U.S. PATENT DOCUMENTS

| | | | | |
|---|---|---|---|---|
| 2009/0095461 A1* | 4/2009 | Lemak | ............... | H05K 7/20472 165/905 |
| 2011/0014417 A1* | 1/2011 | Lemak | ............... | H01L 23/4006 427/407.1 |

(Continued)

FOREIGN PATENT DOCUMENTS

| | | |
|---|---|---|
| JP | 2011-159662 A | 8/2011 |
| JP | 2011-199202 A | 10/2011 |

(Continued)

*Primary Examiner* — Sherman Ng
(74) *Attorney, Agent, or Firm* — Volpe Koenig

(57) ABSTRACT

An electronic element mounting substrate includes: a first substrate including a first principal face; a second substrate located inside the first substrate in a plan view of the electronic element mounting substrate, the second substrate being made of a carbon material; a third substrate located between the first substrate and the second substrate in the plan view, the third substrate being made of a carbon material; and a first mounting portion for mounting a first electronic element, the first mounting portion being located on the first principal face side in a thickness direction of the substrate. The second substrate and the third substrate each have a low heat conduction direction and a high heat conduction direction. The second substrate and the third substrate is arranged so that the low heat conduction directions thereof are perpendicular to each other, and the high heat conduction directions thereof are perpendicular to each other.

20 Claims, 22 Drawing Sheets

(30) Foreign Application Priority Data

Jul. 27, 2018 (JP) .............................. JP2018-141501
Jul. 27, 2018 (JP) .............................. JP2018-141503

(51) Int. Cl.

| | |
|---|---|
| *H01L 23/13* | (2006.01) |
| *H01L 23/498* | (2006.01) |
| *H05K 1/03* | (2006.01) |
| *H01L 23/15* | (2006.01) |
| *H01L 23/00* | (2006.01) |

(52) U.S. Cl.

CPC ......... *H05K 1/0204* (2013.01); *H05K 1/0306* (2013.01); *H01L 23/15* (2013.01); *H01L 24/48* (2013.01); *H01L 24/49* (2013.01); *H01L 2224/48227* (2013.01); *H01L 2224/49171* (2013.01); *H01L 2224/49173* (2013.01)

(56) References Cited

U.S. PATENT DOCUMENTS

| | | | |
|---|---|---|---|
| 2011/0303399 A1 | 12/2011 | Sakimichi et al. | |
| 2012/0152510 A1* | 6/2012 | Noda ...................... | H01L 24/83 228/208 |
| 2015/0382509 A1* | 12/2015 | Nagata ................ | H01L 23/3733 361/710 |
| 2017/0213778 A1 | 7/2017 | Yamamoto et al. | |
| 2018/0063961 A1* | 3/2018 | Kim .................... | H01L 23/3675 |

FOREIGN PATENT DOCUMENTS

| | | |
|---|---|---|
| JP | 2013-175508 A | 9/2013 |
| WO | 2016/079921 A1 | 5/2016 |

\* cited by examiner

FIG. 4
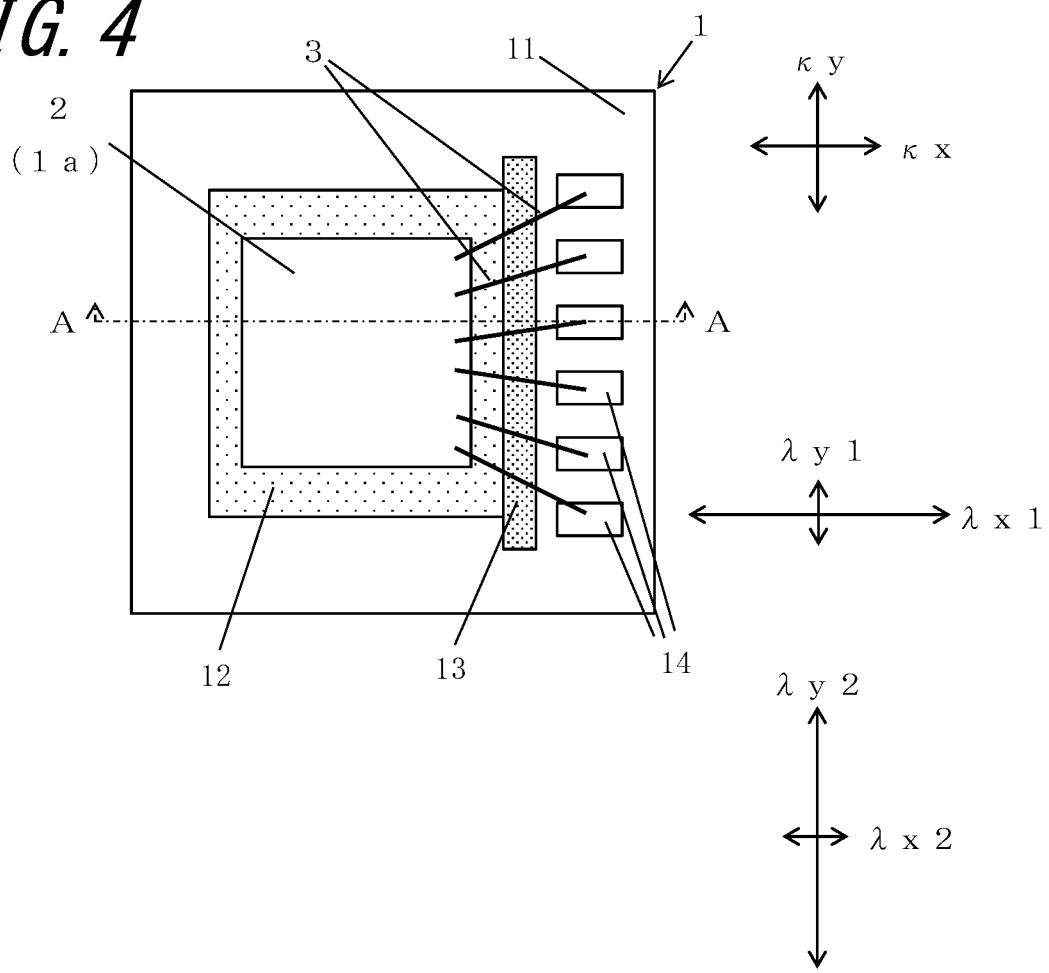
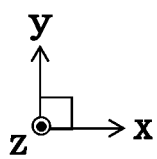

FIG. 6
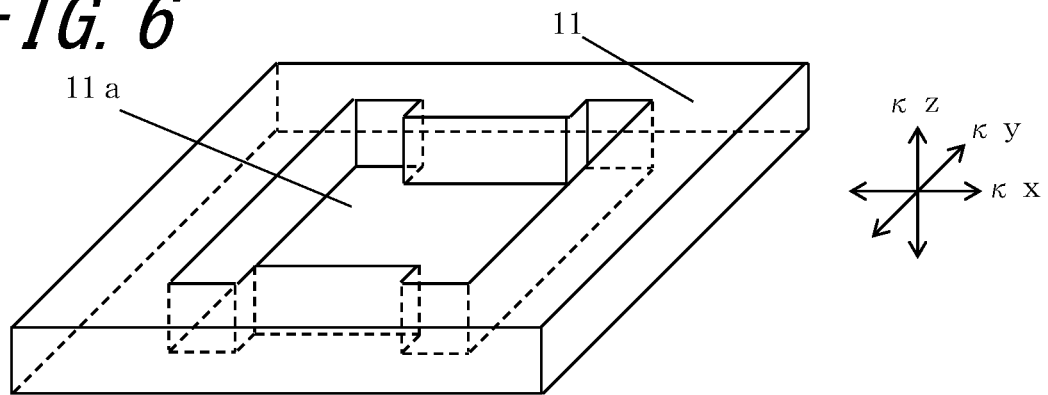
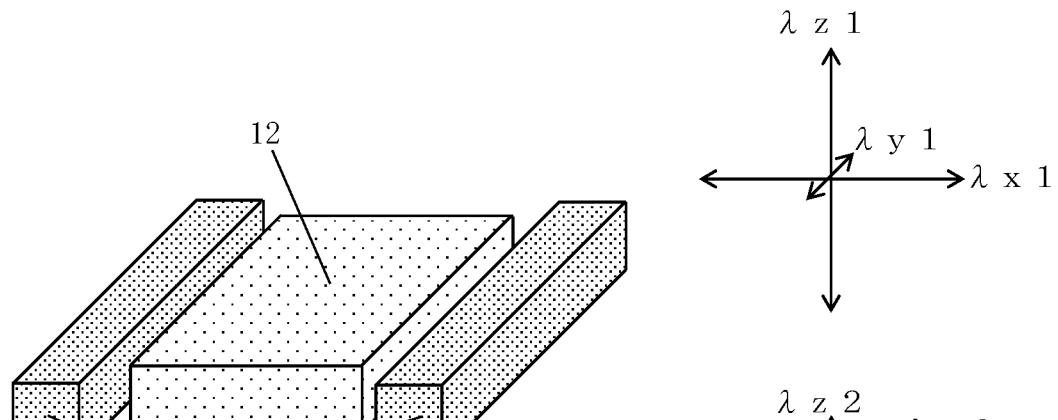
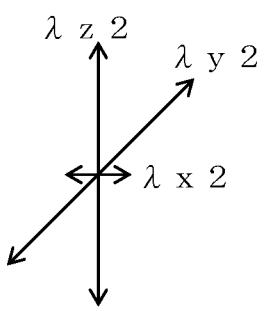
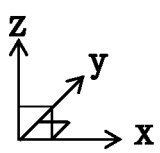

FIG. 11
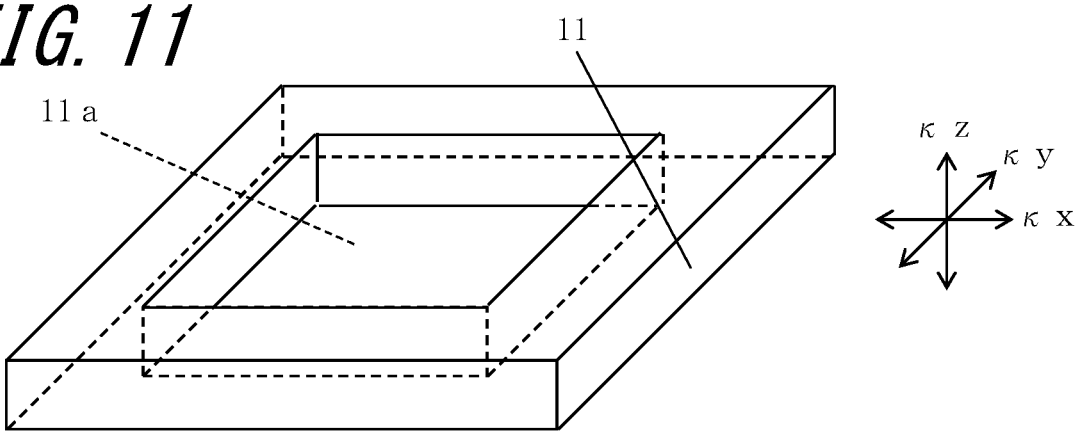
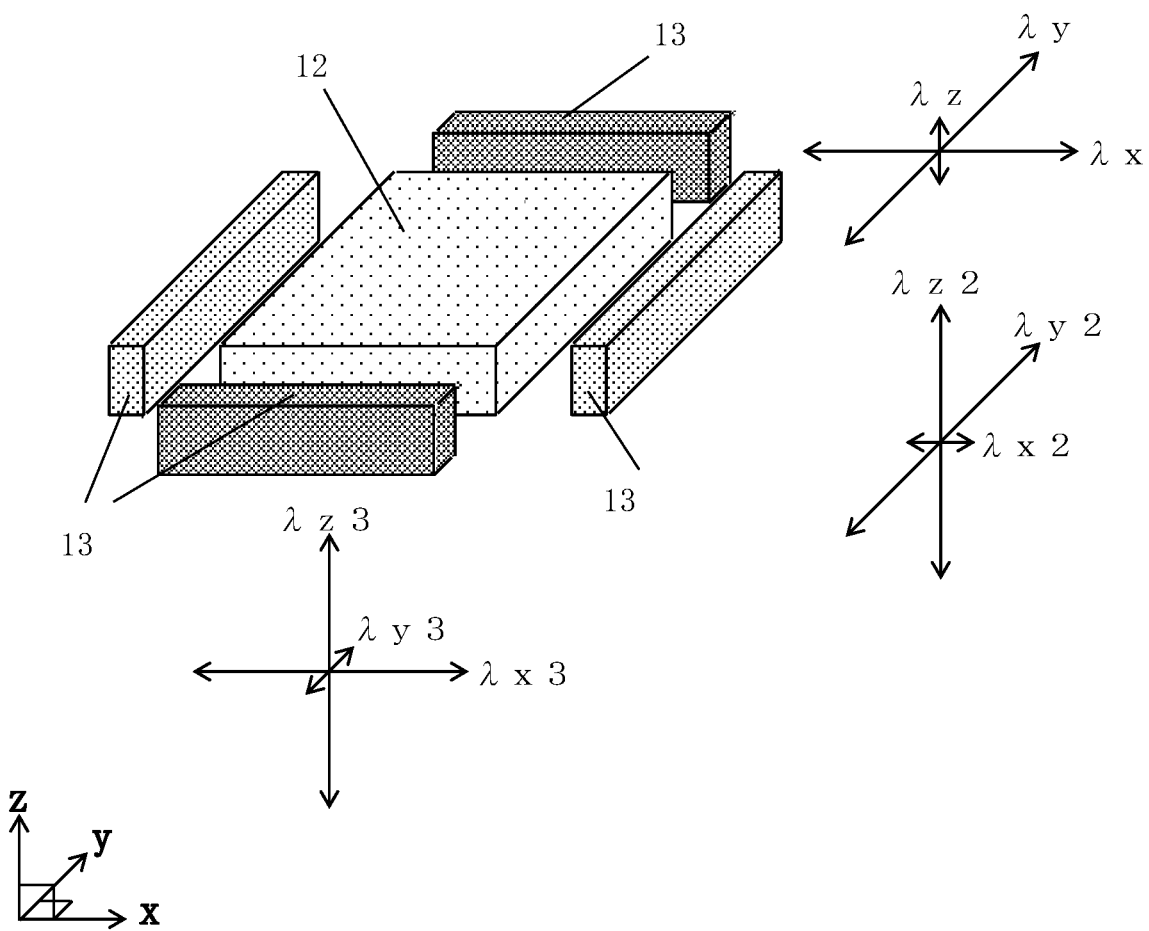

FIG. 12A
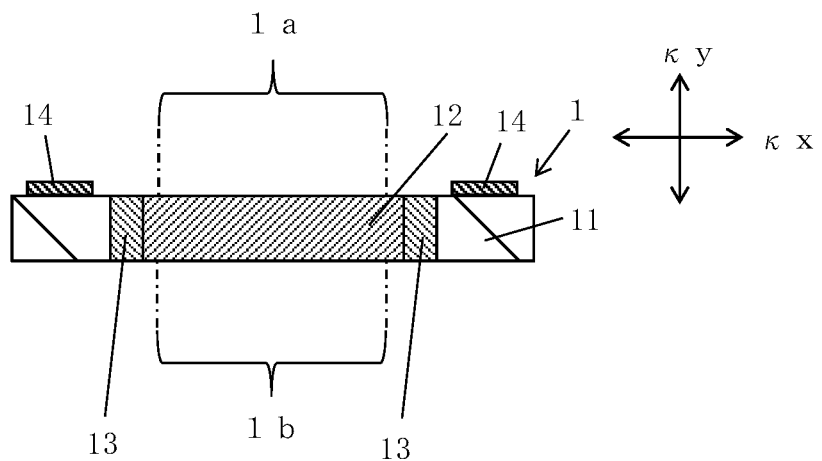
FIG. 12B
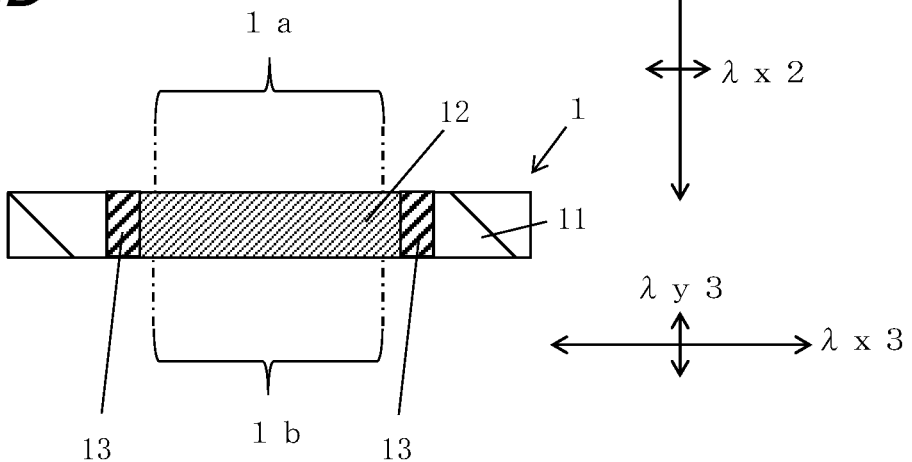
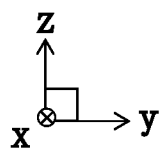

FIG. 14
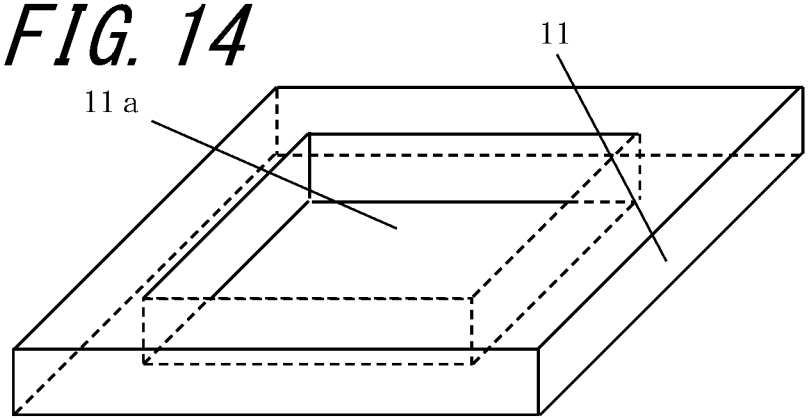
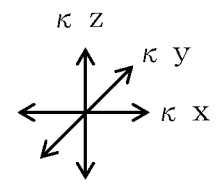
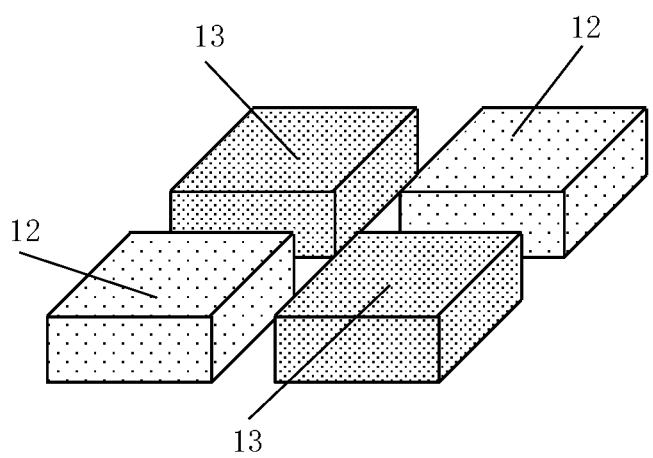
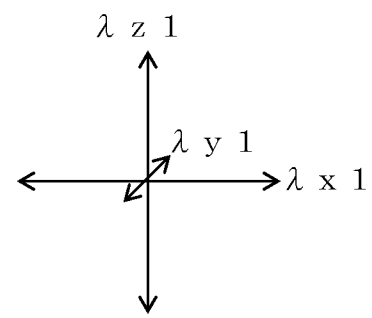
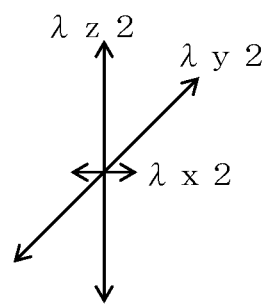
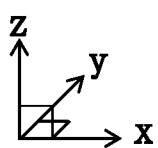

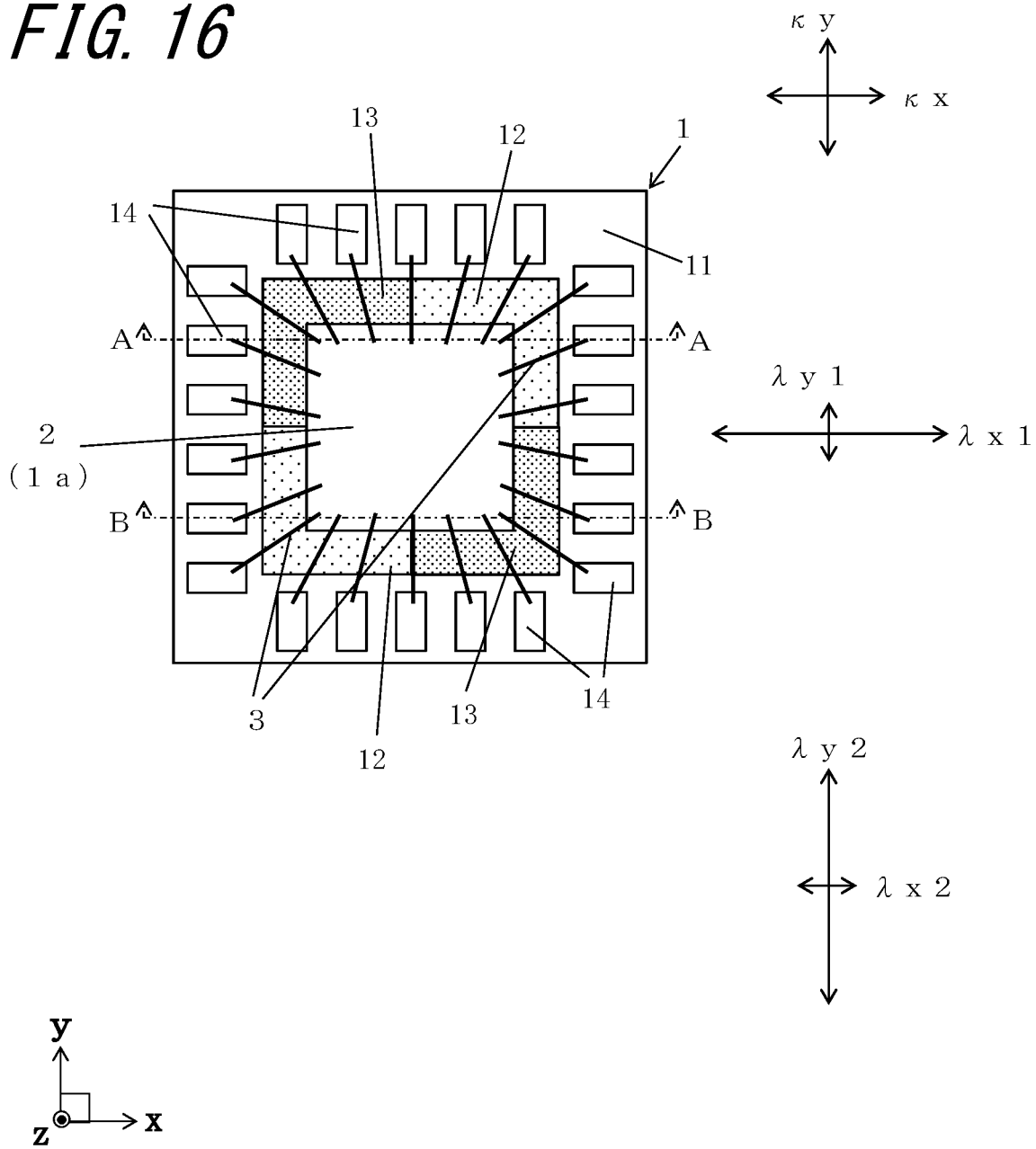

FIG. 21
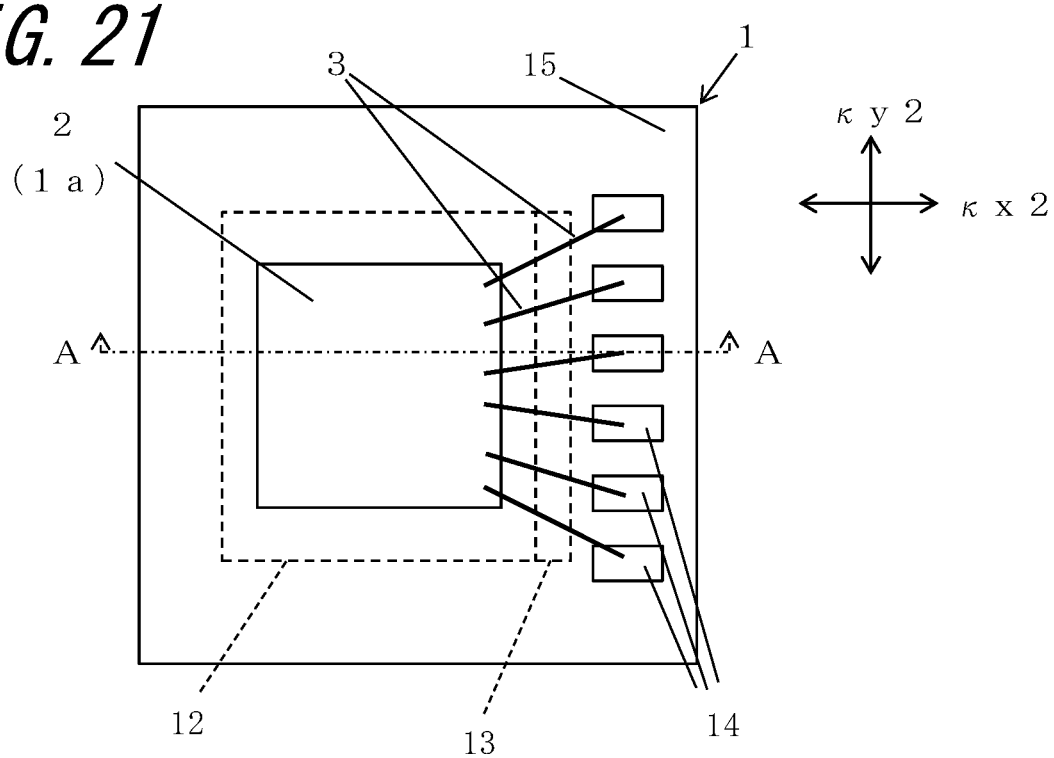
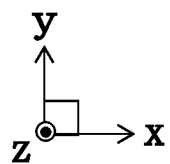

ELECTRONIC ELEMENT MOUNTING SUBSTRATE, ELECTRONIC DEVICE, AND ELECTRONIC MODULE

CROSS-REFERENCE TO RELATED APPLICATION

This application is a national stage entry according to 35 U.S.C. 371 of International Application No. PCT/JP2019/025658 filed on Jun. 27, 2019, which claims priority to Japanese Patent Application Nos. 2018-122144 filed on Jun. 27, 2018, 2018-122143 filed on Jun. 27, 2018, 2018-141503 filed on Jul. 27, 2018, and 2018-141501 filed on Jul. 27, 2018, the contents of which are entirely incorporated herein by reference.

TECHNICAL FIELD

The present disclosure relates to an electronic element mounting substrate, an electronic device, and an electronic module.

BACKGROUND

In the related art, an electronic element mounting substrate includes: an insulating substrate including a first principal face, a second principal face, and side faces; and an electronic element mounting portion and a metallic layer located on each of the first principal face and the second principal face of the insulating substrate. In the electronic element mounting substrate, an electronic element is mounted on the electronic element mounting portion. Thus, an electronic device is constructed (refer to Japanese Unexamined Patent Publication JP-A 2013-175508).

SUMMARY

An electronic element mounting substrate according to the disclosure includes: a first substrate including a first face and a second face opposite to the first face; a second substrate including a third face and a fourth face opposite to the third face, the second substrate being made of a carbon material; a third substrate including a fifth face and a sixth face opposite to the fifth face, the third substrate being made of a carbon material; and a first mounting portion for mounting a first electronic element; wherein, the first mounting portion overlaps the third face in a plan view of the electronic element mounting substrate, the second substrate is located inside the first substrate in the plan view of the electronic element mounting substrate, the third substrate is located between the first substrate and the second substrate in the plan view of the electronic element mounting substrate, the second substrate and the third substrate each have a low heat conduction direction in which heat conduction is low, and a high heat conduction direction in which the heat conduction is high, and the second substrate and the third substrate are arranged so that the low heat conduction direction of the second substrate and the low heat conduction direction of the third substrate are perpendicular to each other, and the high heat conduction direction of the second substrate and the high heat conduction direction of the third substrate are perpendicular to each other.

An electronic device according to the disclosure includes: the electronic element mounting substrate mentioned above; and a first electronic element which is mounted on the first mounting portion of the electronic element mounting substrate.

An electronic module according to the disclosure includes: the electronic device mentioned above; and a module substrate to which the electronic device is connected.

BRIEF DESCRIPTION OF DRAWINGS

FIG. 4 is a top view showing the electronic element mounting substrate shown in FIGS. 1A and 1B on which an electronic element is mounted;

FIG. 6 is an exploded perspective view showing a first substrate, a second substrate, and a third substrate of the electronic element mounting substrate shown in FIGS. 5A and 5B in a disassembled state;

FIG. 11 is an exploded perspective view showing a first substrate, a second substrate, and a third substrate of the electronic element mounting substrate shown in FIGS. 10A and 10B in a disassembled state;

FIG. 12A is a vertical sectional view of the electronic element mounting substrate taken along the line A-A shown in FIG. 10A, and FIG. 12B is a vertical sectional view of the electronic element mounting substrate taken along the line B-B shown in FIG. 10A;

FIG. 14 is an exploded perspective view showing a first substrate, a second substrate, and a third substrate of the electronic element mounting substrate shown in FIGS. 13A and 13B in a disassembled state;

FIG. 16 is a top view showing the electronic element mounting substrate shown in FIGS. 13A and 13B on which an electronic element is mounted;

FIG. 21 is a top view showing the electronic element mounting substrate shown in FIGS. 18A and 18B on which an electronic element is mounted.

DETAILED DESCRIPTION

Figure 1A:
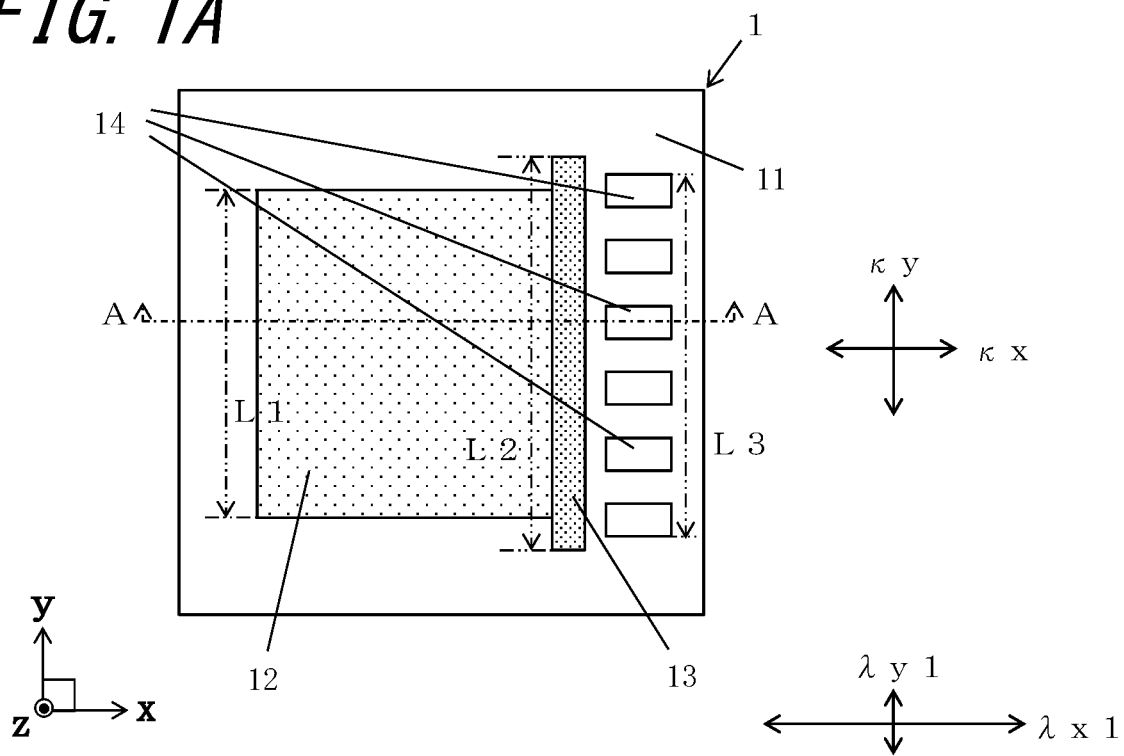
FIG. 1A is a top view showing an electronic element mounting substrate according to a first embodiment.
Figure 1B:
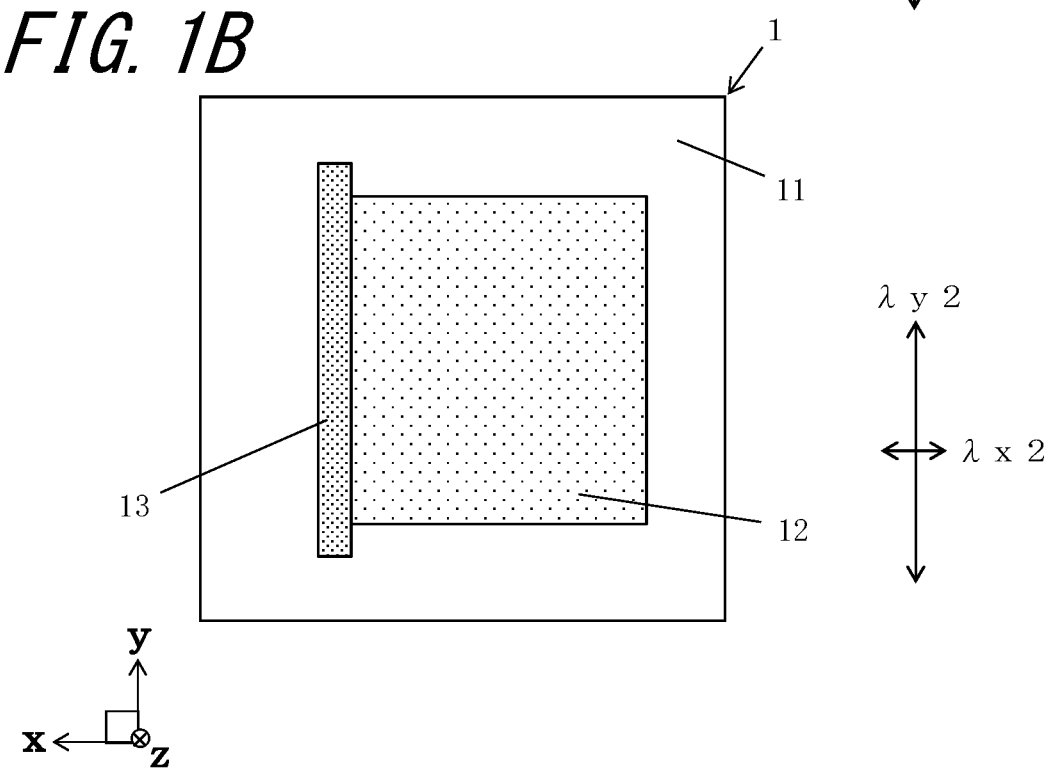
FIG. 1B is a bottom view of the substrate shown in FIG. 1A.

Several exemplary embodiments of the disclosure will now be described with reference to the accompanying drawings.

First Embodiment

As illustrated in FIGS. 1A to 4, an electronic element mounting substrate 1 for an electronic element to be mounted according to a first embodiment of the disclosure includes a first substrate 11, a second substrate 12, and a third substrate 13. An electronic device includes the electronic element mounting substrate 1, an electronic element 2 (which may also be referred to as "first electronic element 2") mounted on a mounting portion 1a (which may also be referred to as "first mounting portion 1a") of the electronic element mounting substrate 1, and a wiring substrate in which the electronic element mounting substrate 1 is installed. For example, the electronic device is connected via a joining material to a connection pad disposed on a module substrate constituting an electronic module.

The electronic element mounting substrate 1 according to this embodiment includes: the first substrate 11 including a first principal face and a second principal face located opposite to the first principal face; the second substrate 12 located inside the first substrate 11 in the plan view, the second substrate 12 including a third principal face located on the first principal face side in the thickness direction and a fourth principal face located opposite to the third principal face, the second substrate 12 being made of a carbon material; the third substrate 13 located between the first substrate 11 and the second substrate 12 in the plan view, the third substrate 13 including a fifth principal face located on the first principal face side in the thickness direction and a sixth principal face located opposite to the fifth principal face, the third substrate 13 being made of a carbon material; and the mounting portion 1a for mounting an electronic element the mounting portion 1a being located on the first principal face. The second substrate 12 and the third substrate 13 each have a low heat conduction direction in which heat conduction is low and a high heat conduction direction in which heat conduction is high. The second substrate 12 and the third substrate 13 are arranged so that the low heat conduction directions of the second substrate 12 and the third substrate 13 are perpendicular to each other, and also the high heat conduction directions of the second substrate and the third substrate are perpendicular to each other. In FIGS. 1A to 4, the electronic element 2 is shown as mounted on an xy plane in an imaginary xyz space. In FIGS. 1A to 4, an upward direction conforms to a positive direction along an imaginary z axis. In the following description, the terms "upper" and "lower" are used as a matter of convenience and are not intended to be limiting of the oriented positions of the electronic element mounting substrate 1, etc. in a vertical direction in terms of actual usage.

Figure 2:
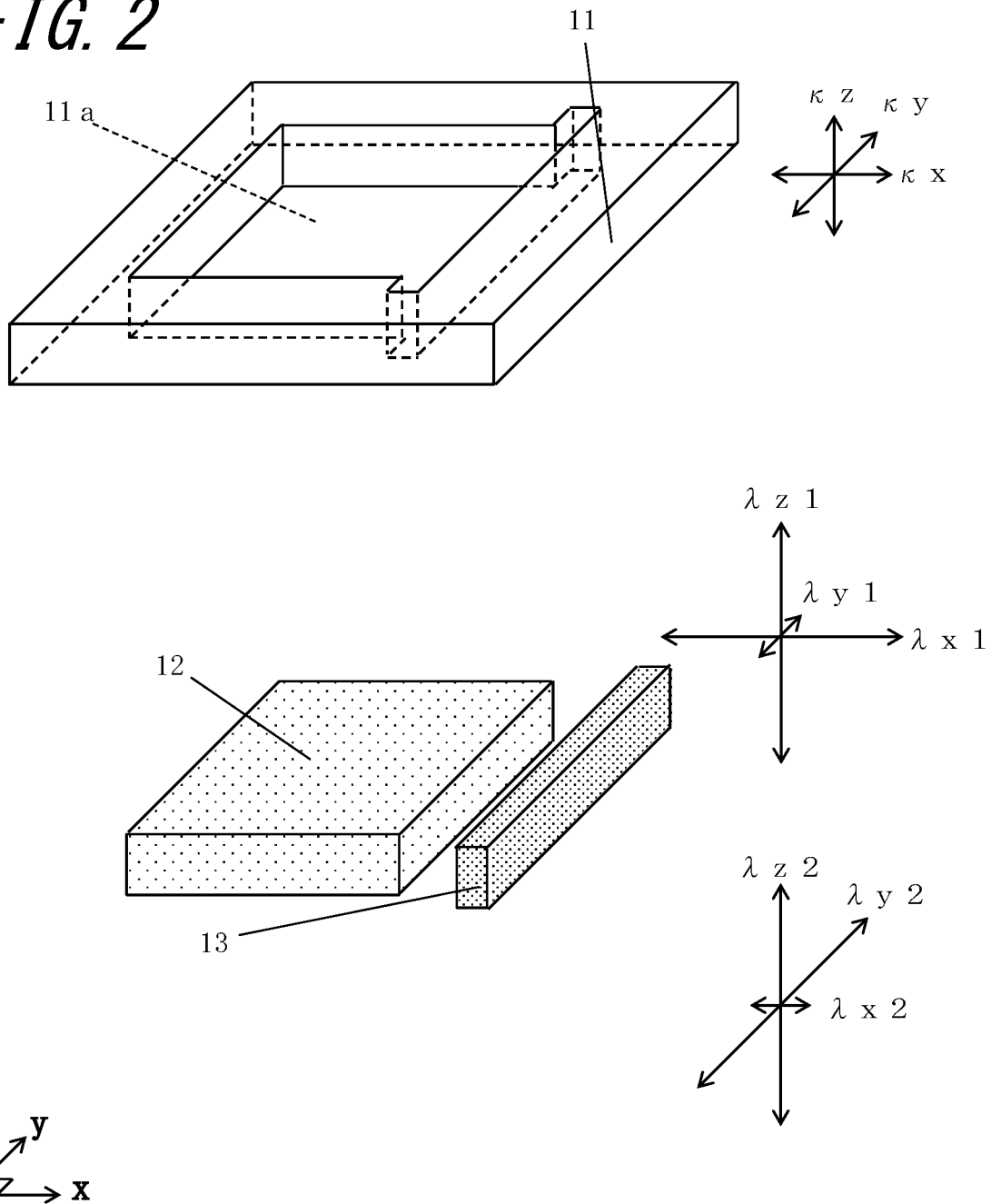
FIG. 2 is an exploded perspective view showing a first substrate, a second substrate, and a third substrate of the electronic element mounting substrate shown in FIGS. 1A and 1B in a disassembled state.
Figure 3:
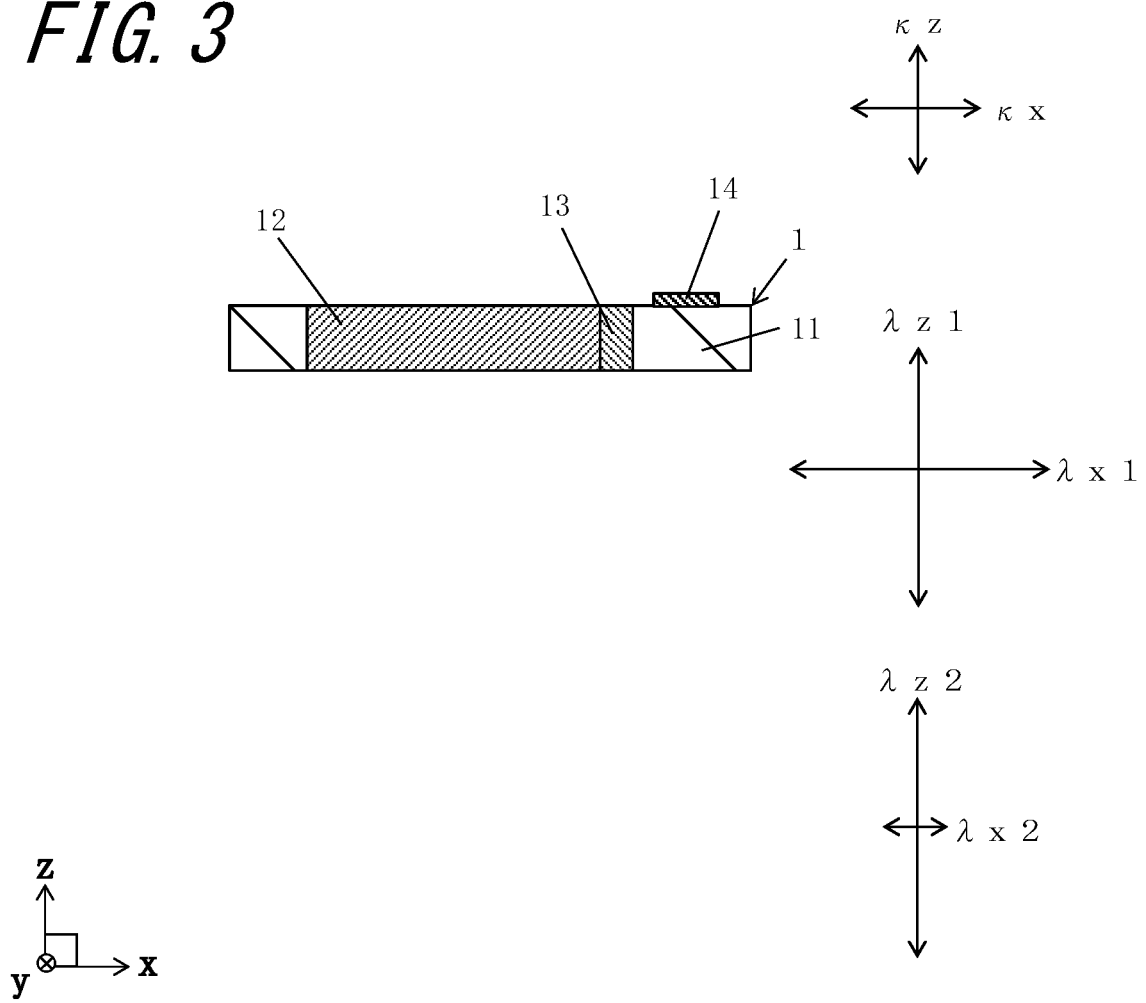
FIG. 3 is a vertical sectional view of the electronic element mounting substrate taken along the line A-A shown in FIG. 1A.
Figure 5A:
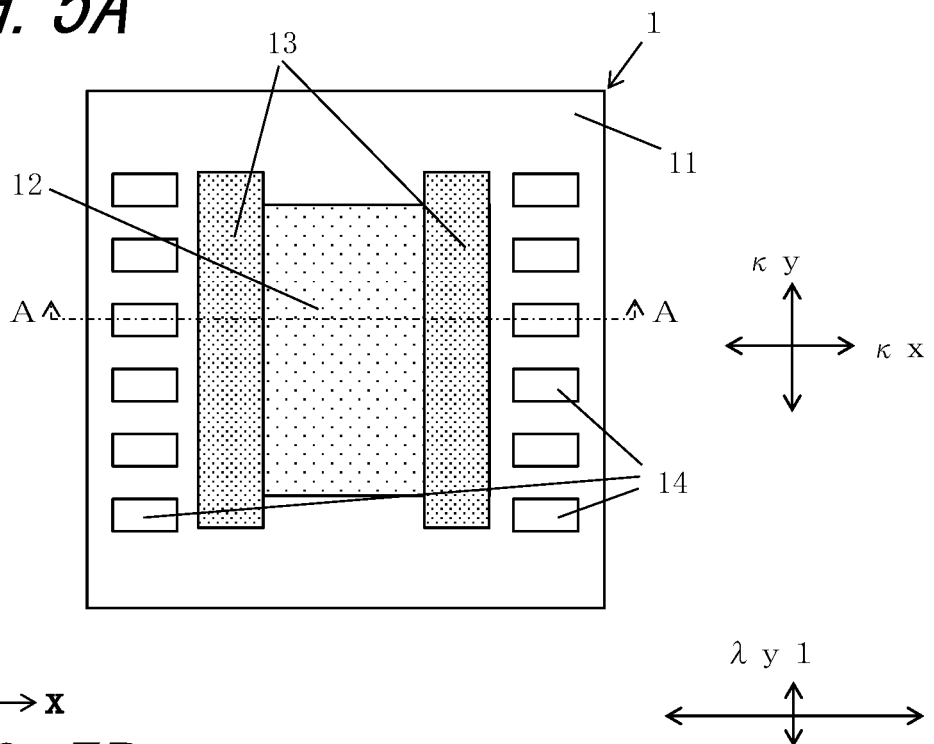
FIG. 5A is a top view showing an electronic element mounting substrate according to a second embodiment.
Figure 5B:
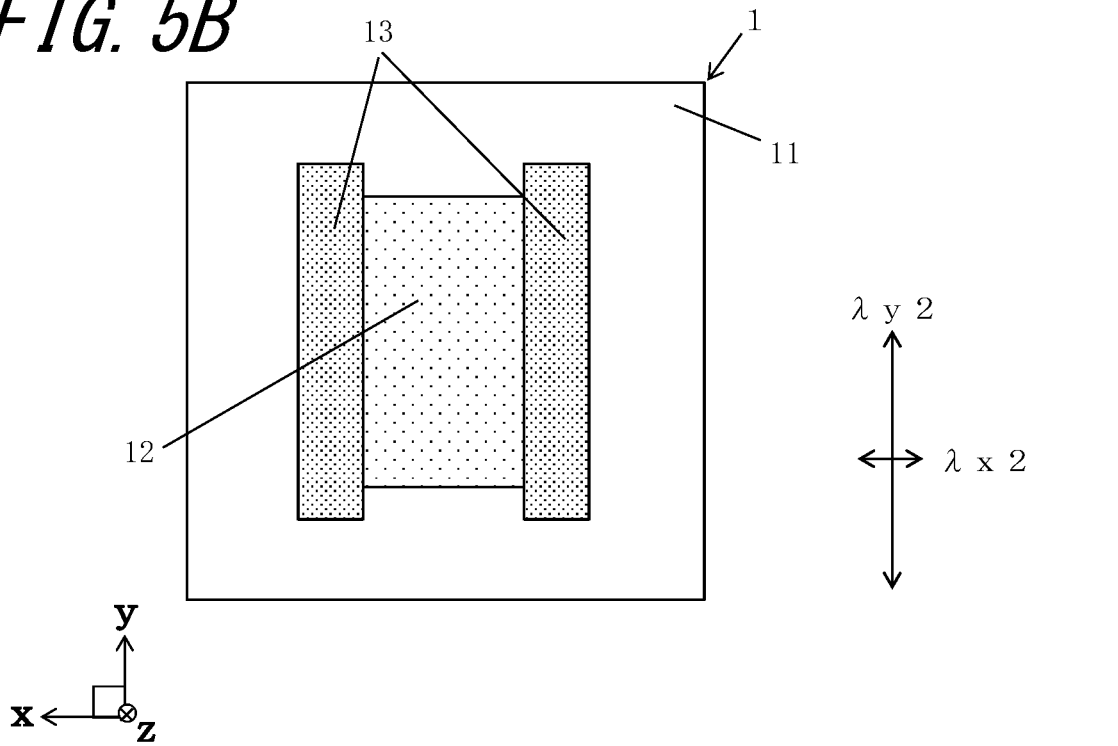
FIG. 5B is a bottom view of the substrate shown in FIG. 5A.
Figure 7:
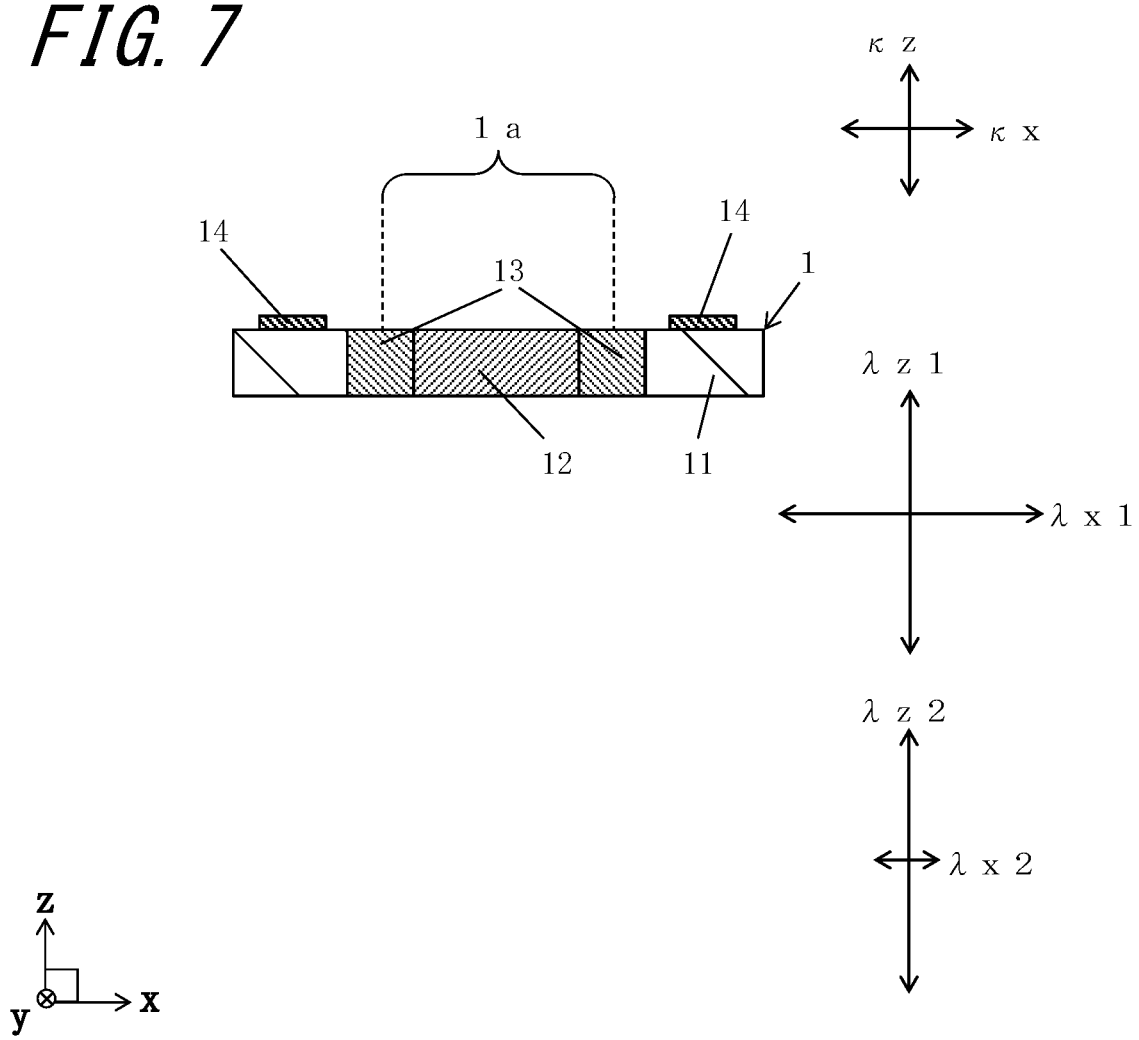
FIG. 7 is a vertical sectional view of the electronic element mounting substrate taken along the line A-A shown in FIG. 5A.
Figure 8:
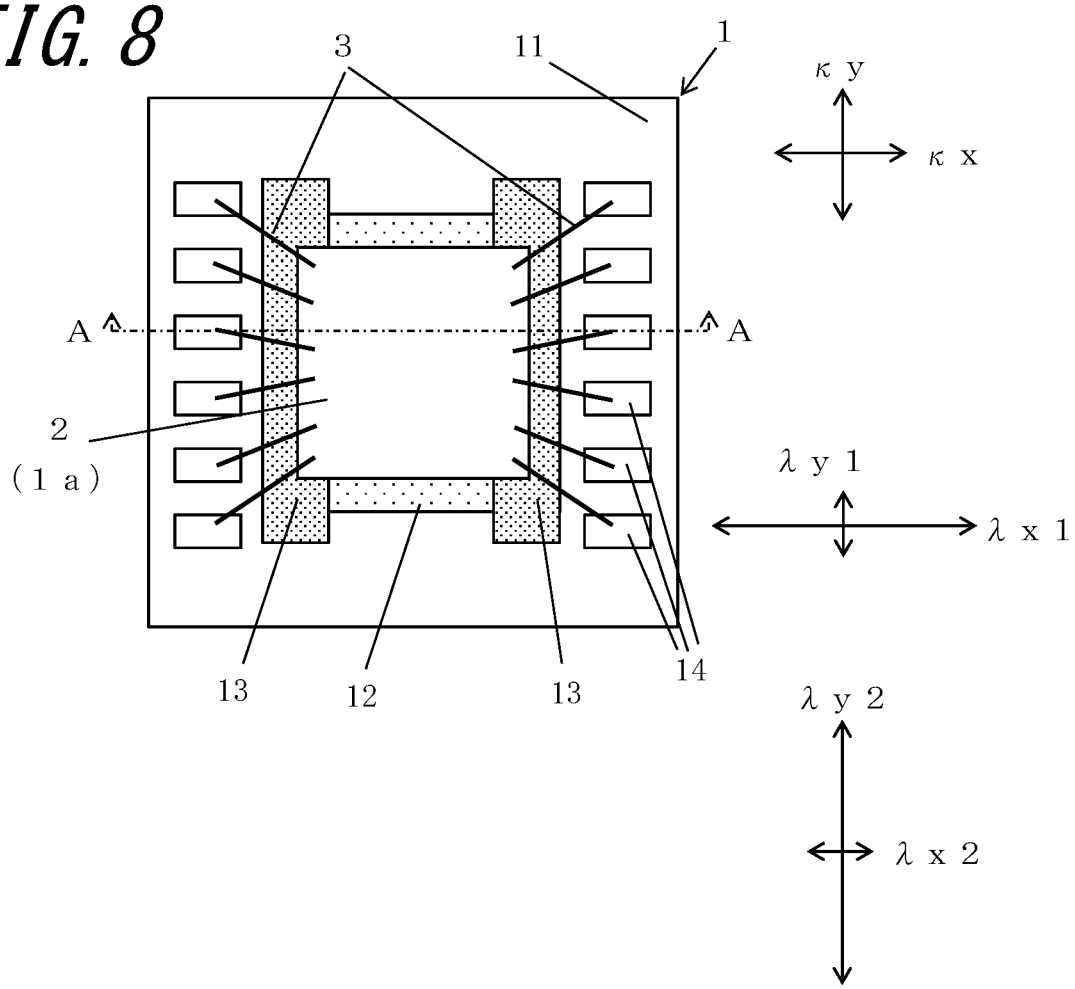
FIG. 8 is a top view showing the electronic element mounting substrate shown in FIGS. 5A and 5B on which an electronic element is mounted.
Figure 9:
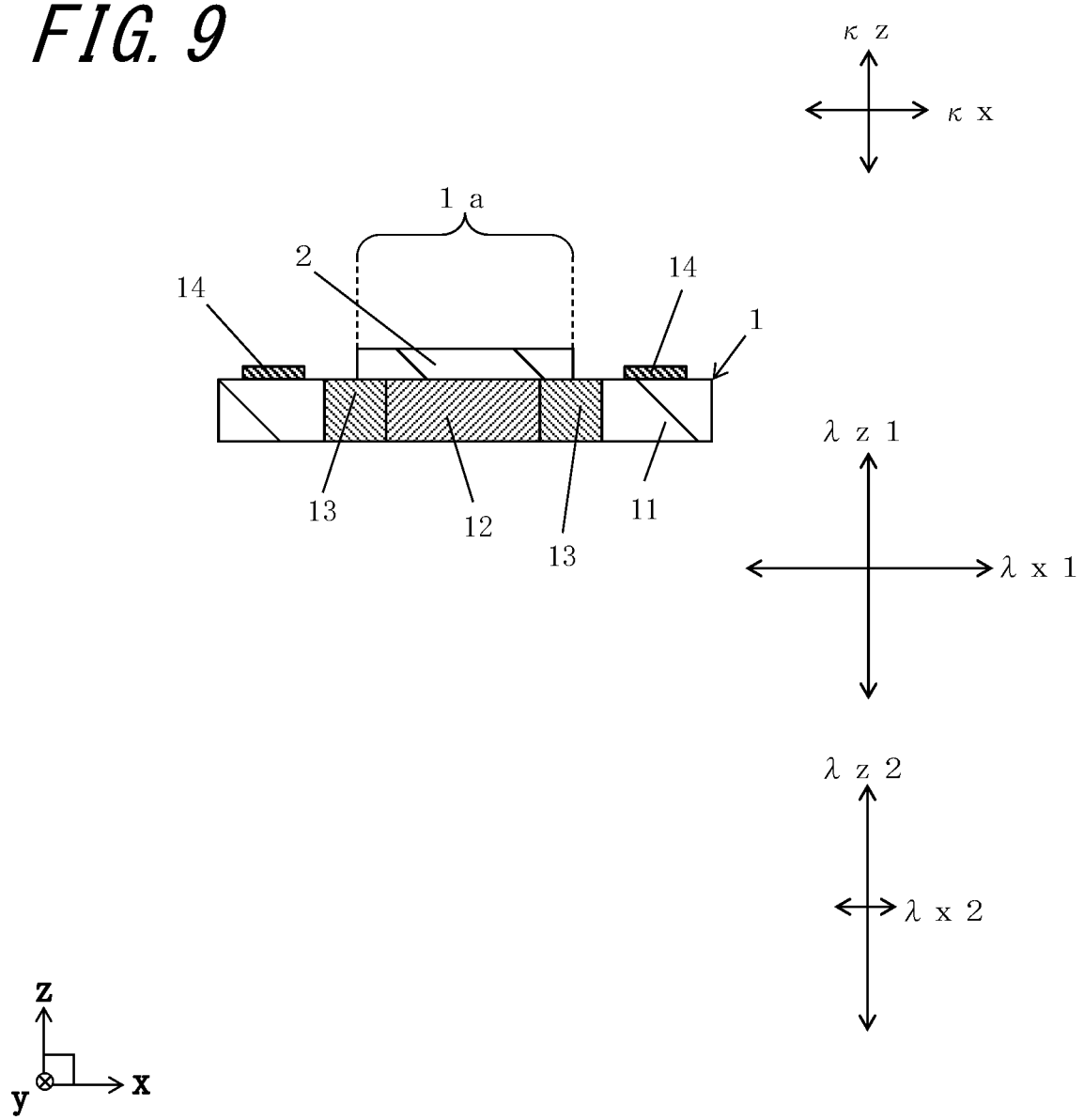
FIG. 9 is a vertical sectional view of the electronic element mounting substrate on which an electronic element is mounted taken along the line A-A shown in FIG. 8.
Figure 10A:
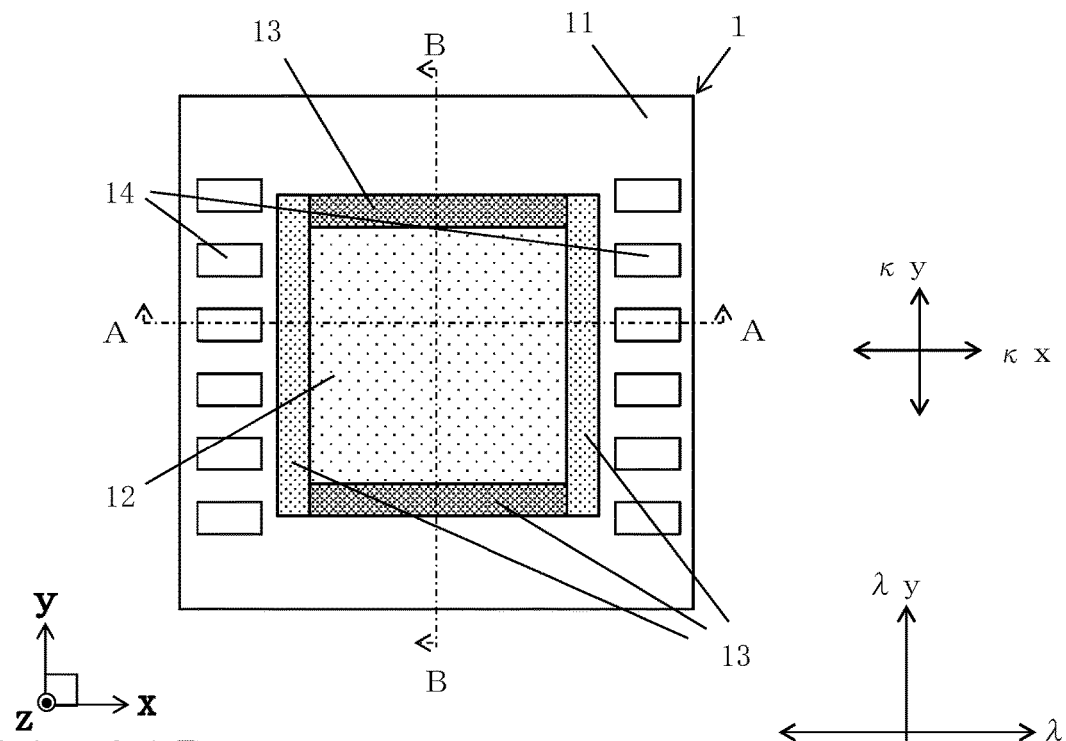
FIG. 10A is a top view showing an electronic element mounting substrate according to a third embodiment.
Figure 10B:
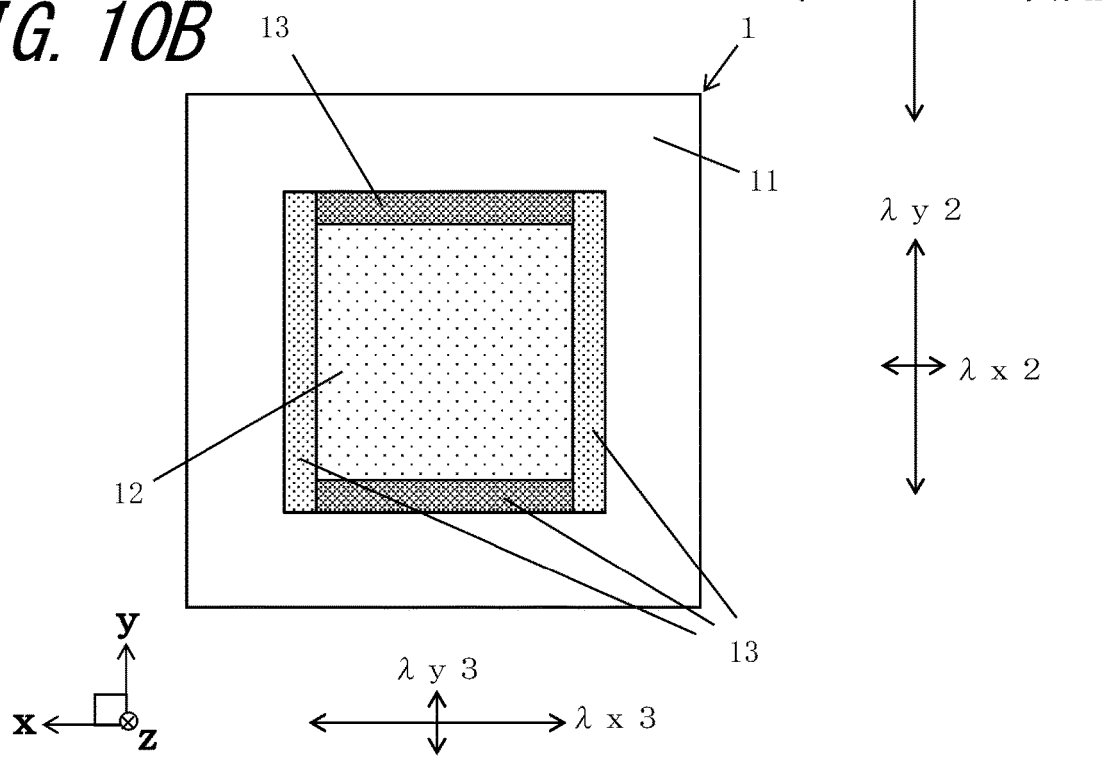
FIG. 10B is a bottom view of the substrate shown in FIG. 10A.
Figure 13A:
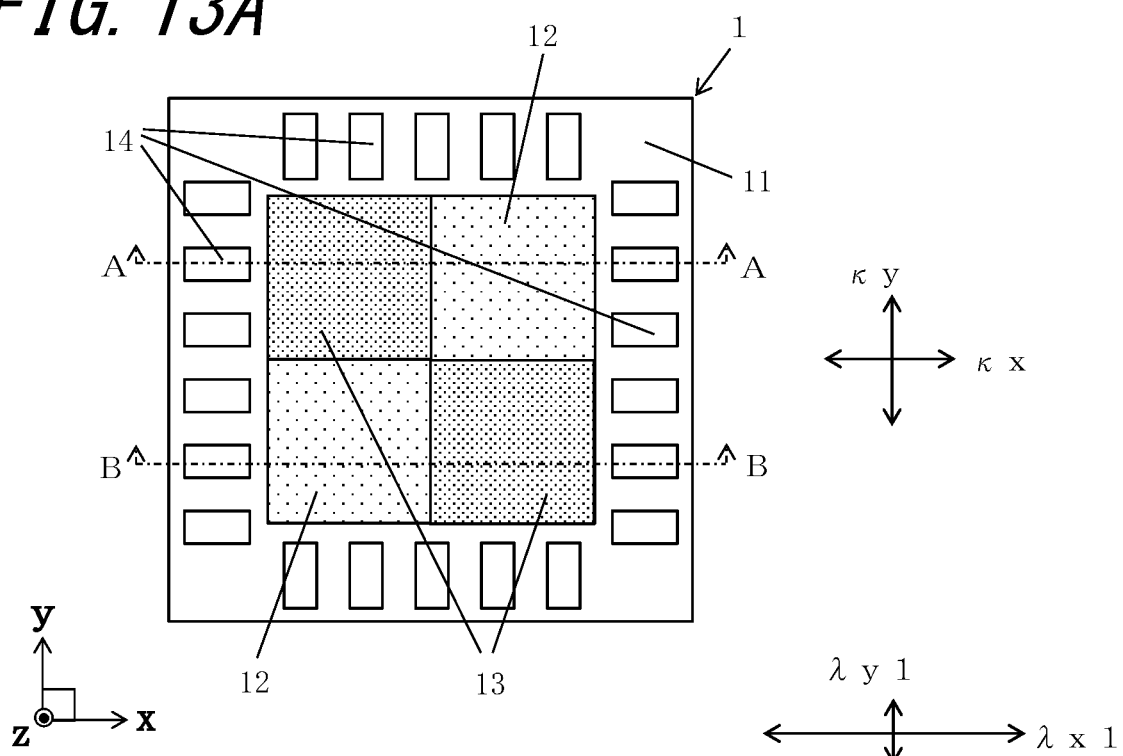
FIG. 13A is a top view showing an electronic element mounting substrate according to a fourth embodiment.
Figure 13B:
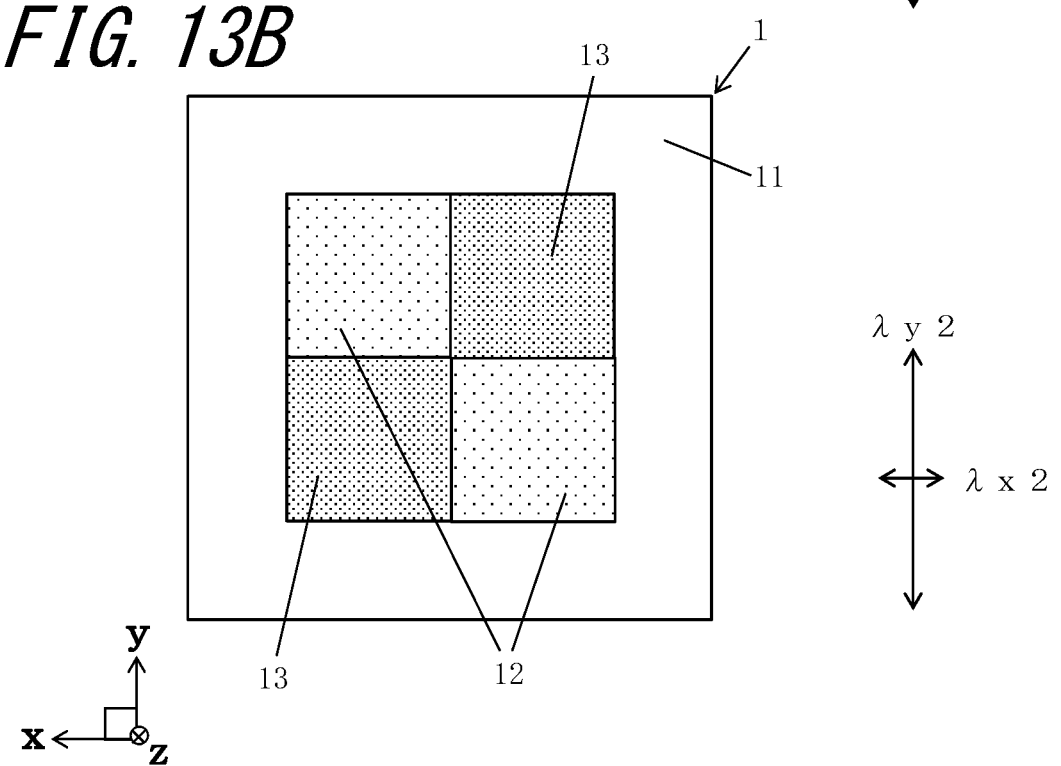
FIG. 13B is a bottom view of the substrate shown in FIG. 13A.
Figure 15A:
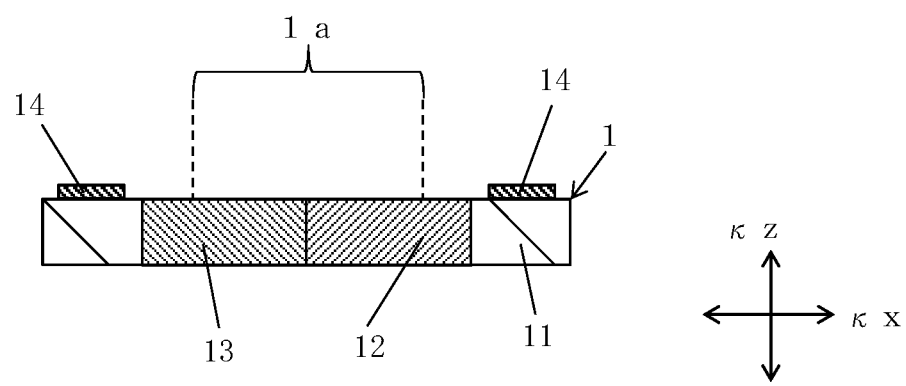
FIG. 15A is a vertical sectional view of the electronic element mounting substrate taken along the line A-A shown in FIG. 13A.
Figure 15B:
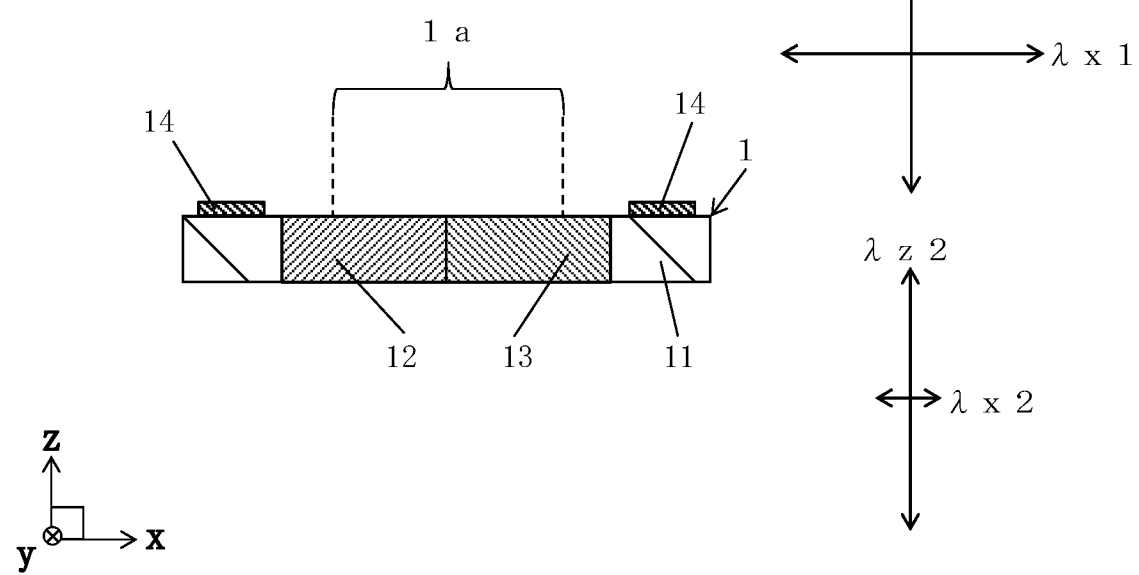
FIG. 15B is a vertical sectional view of the electronic element mounting substrate taken along the line B-B shown in FIG. 13A.
Figure 17A:
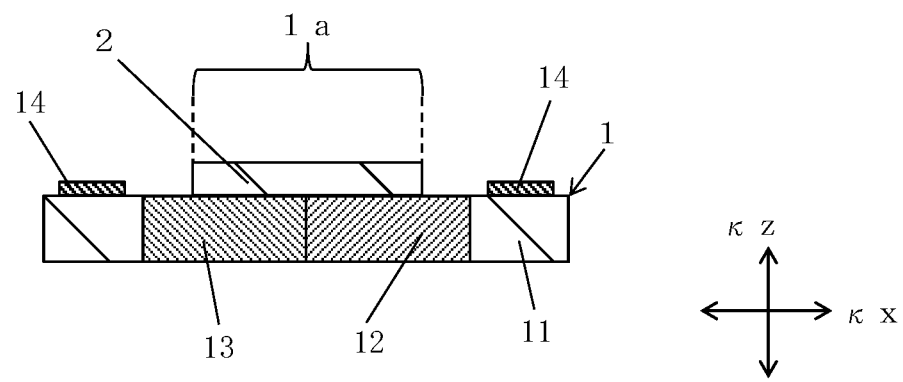
FIG. 17A is a vertical sectional view of the electronic element mounting substrate on which the electronic element is mounted taken along the line A-A shown in FIG. 16.
Figure 17B:
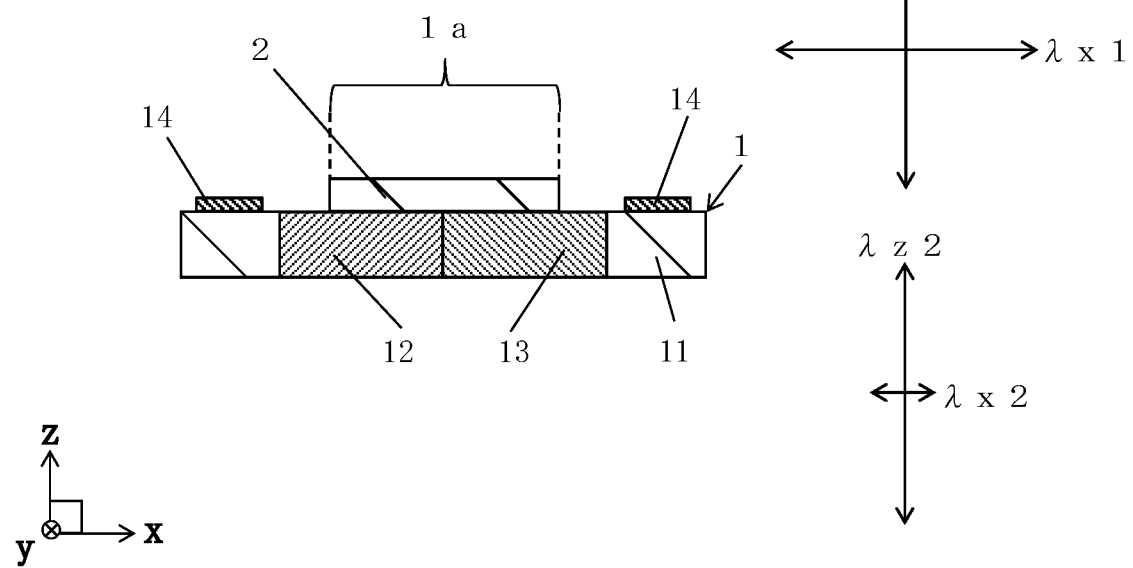
FIG. 17B is a vertical sectional view of the electronic element mounting substrate on which the electronic element is mounted taken along the line B-B shown in FIG. 16.
Figure 18A:
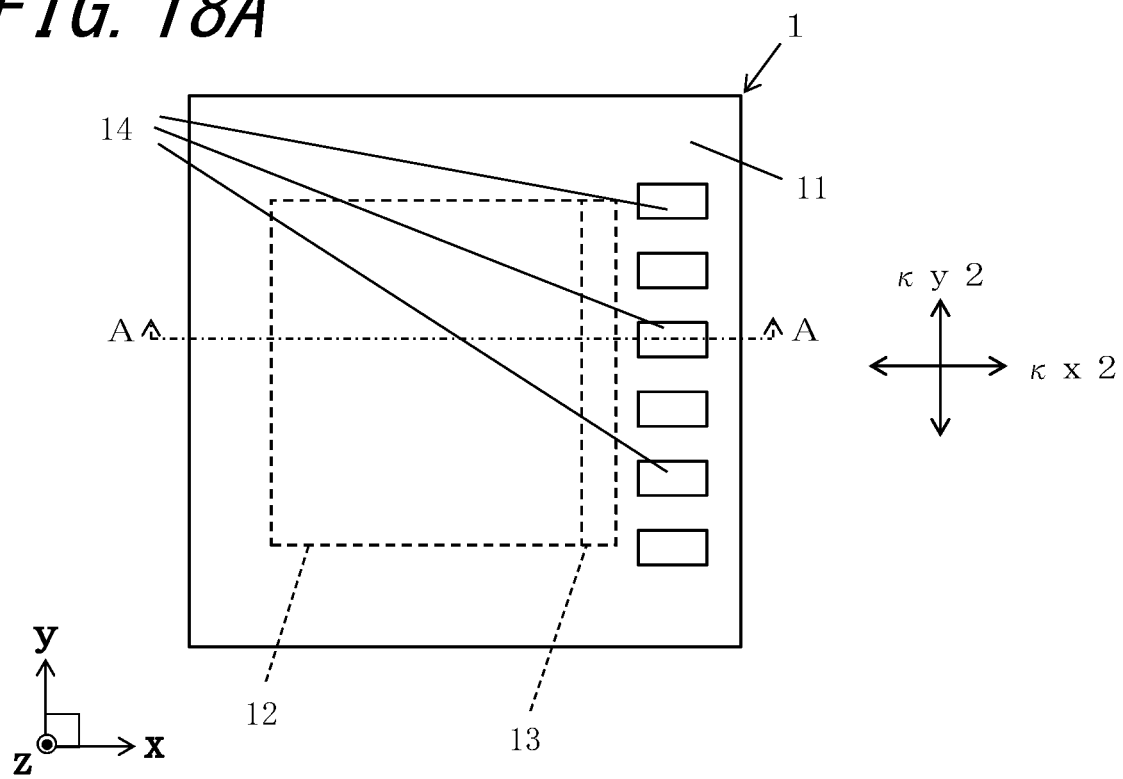
FIG. 18A is a top view showing an electronic element mounting substrate according to a fifth embodiment.
Figure 18B:
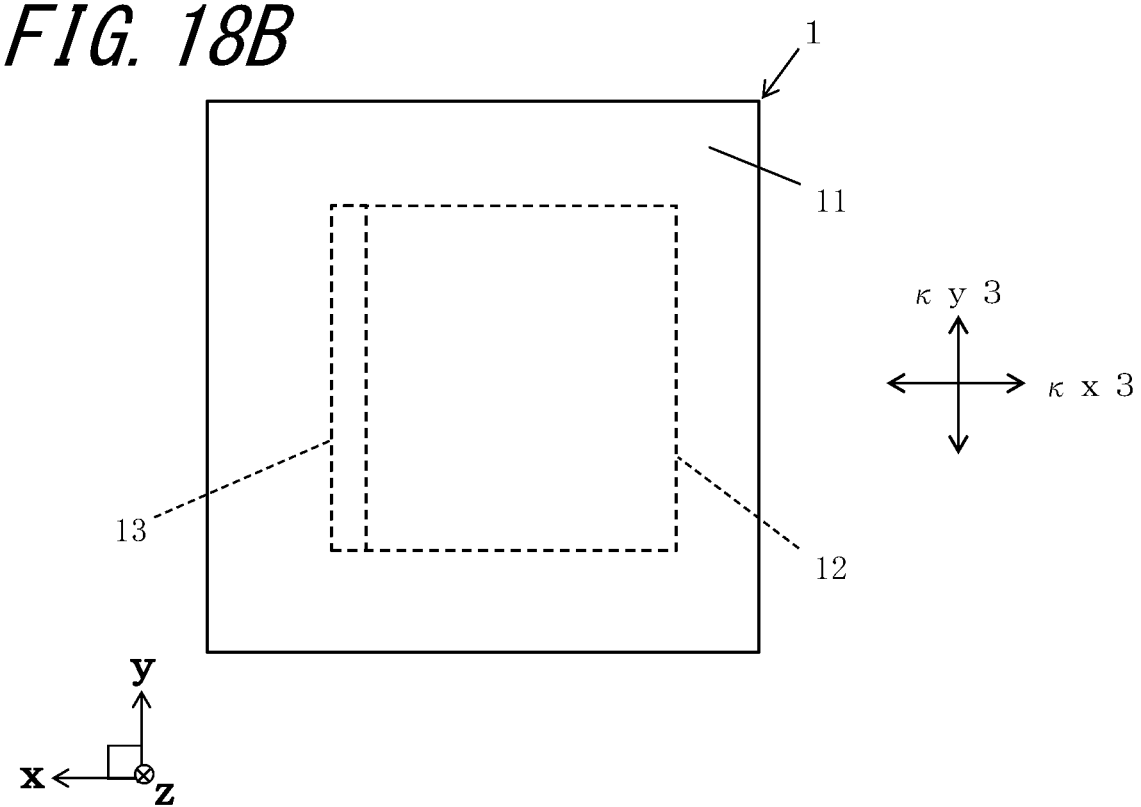
FIG. 18B is a bottom view of the substrate shown in FIG. 18A.

In FIG. 2, in the illustrated first substrate 11, the outer surface of the first substrate 11 and the inner surface of a through hole 11a of the first substrate 11, which become invisible as viewed in perspective, are indicated by dotted lines. In FIGS. 1A, 1B, 2, and 4, the illustrated second substrate 12 and third substrate 13 are each indicated by a dot-shaded area.

The first substrate 11 includes the first principal face (upper surface as viewed in FIGS. 1A to 4) and the second principal face (lower surface as viewed in FIGS. 1A to 4). The first principal face and the second principal face are located opposite to each other. The first substrate 11, including a single or a plurality of insulating layers, is shaped in a quadrangular plate including two pairs of opposite sides (four sides in total) positioned in relation to each of the first principal face and the second principal face in the plan view. The first substrate 11 is provided with the through hole 11a formed so as to pass through between the first principal face and the second principal face thereof. The through hole 11a is polygonal, e.g. quadrangular, or circular in plan configuration. The first substrate 11 serves also as a support for supporting the second substrate 12, the third substrate 13, and the electronic element 2.

For example, the first substrate 11 may be made of ceramics such as an aluminum oxide sintered body (alumina ceramics), an aluminum nitride sintered body, a mullite sintered body, and a glass ceramics sintered body. For example, in the case where an aluminum nitride sintered body is used for the first substrate 11, a way to produce the first substrate 11 including a single or a plurality of insulating layers is as follows. A slurry is prepared first by admixing suitable organic binder, solvent, etc. in raw material powder such as aluminum nitride (AlN), erbium oxide ($Er_2O_3$), yttrium oxide ($Y_2O_3$), etc. The resulting slurry is shaped into a sheet by using heretofore known means such as a doctor blade method or a calendar roll method, thereby forming a ceramic green sheet. On an as needed basis, a plurality of ceramic green sheets are stacked into a laminate. The ceramic green sheet or the laminate is fired at a high temperature (about 1800° C.).

The second substrate 12 includes the third principal face (upper surface as viewed in FIGS. 1A to 4) and the fourth principal face (lower surface as viewed in FIGS. 1A to 4). The third principal face and the fourth principal face are located opposite to each other.

The third substrate 13 includes the fifth principal face (upper surface as viewed in FIGS. 1A to 4) and the sixth principal face (lower surface as viewed in FIGS. 1A to 4). The fifth principal face and the sixth principal face are located opposite to each other.

As illustrated in FIGS. 1A to 4, the second substrate 12 and the third substrate 13 are embedded in the first substrate 11. The second substrate 12 and the third substrate 13 are disposed adjacent to each other in the plan view. That is, as illustrated in FIGS. 1A to 4, the third substrate 13 is located between the first substrate 11 and the second substrate 12 in the plan view.

For example, the second substrate 12 and the third substrate 13 are each made of a carbon material in the form of a graphene laminate structure containing six-membered rings joined together by covalent bonds, in which lamination planes are bound together by van der Waals' forces.

A metallic layer 14 is disposed on the first principal face of the first substrate 11. The metallic layer 14 is used as a connection portion for a connecting member 3 such as a bonding wire, and serves to electrically connect the electronic element 2 and a connection pad of a module substrate.

The metallic layer 14 includes a thin-film layer and a plating layer. For example, the thin-film layer includes a metallic adherent layer and a barrier layer. The metallic adherent layer constituting the thin-film layer is formed on the first principal face of the first substrate 11. Examples of the material for the metallic adherent layer include tantalum nitride, a nickel-chromium material, a nickel-chromium-silicon material, a tungsten-silicon material, a molybdenum-silicon material, tungsten, molybdenum, titanium, and chromium. The metallic adherent layer is deposited on the first principal face of the first substrate 11 or an eighth principal face of a fourth substrate 15 by using a thin-film forming technique such as vapor deposition, ion plating, or sputtering. For example, in the case where vacuum vapor deposition is adopted, a way to form the metallic adherent layer is as follows. The first substrate 11 or the fourth substrate 15 is set in a film-forming chamber of a vacuum evaporator, and a metal piece for forming the metallic adherent layer is placed at an evaporation source within the film-forming chamber. After that, with the interior of the film-forming chamber maintained under vacuum (under a pressure of $10^{-2}$ Pa or below), the metal piece placed at the evaporation source is evaporated under heat, ensuring that the molecules of the described evaporated metal piece are deposited onto the first substrate 11, thereby forming a layer of a thin metallic film for forming the metallic adherent layer. The first substrate 11 provided with the thin metallic film layer is subjected to a resist pattern-forming process using photolithography, and then an excess of the thin metallic film layer is removed by etching. Thus, the metallic adherent layer is obtained. A barrier layer is deposited on an upper surface of the metallic adherent layer. The barrier layer exhibits good adherability and wettability to the metallic adherent layer and the plating layer, and thus serves to join the metallic adherent layer with the plating layer firmly, as well as to prevent mutual diffusion of the metallic adherent layer and the plating layer. For example, the barrier layer is made of a nickel-chromium material, platinum, palladium, nickel, or cobalt. The barrier layer is deposited on the surface of the metallic adherent layer by using a thin-film forming technique such as vapor deposition, ion plating, or sputtering.

Preferably a thickness of the metallic adherent layer is about 0.01 μm to 0.5 μm. The thickness of less than 0.01 μm often results in difficulties in firm adhesion of the metallic adherent layer onto the first substrate 11. The thickness of more than 0.5 μm often results in separation of the metallic adherent layer due to an internal stress developed in the metallic adherent layer-forming process. Moreover, preferably a thickness of the barrier layer is about 0.05 μm to 1 μm. The thickness of less than 0.05 μm often results in occurrence of defects such as pinholes, which may impair barrier layer's performance. The thickness of more than 1 μm often results in accidental separation of the barrier layer due to an internal stress developed in the barrier layer-forming process.

The plating layer is deposited on the exposed surface of the thin-film layer by using electrolytic plating or electroless plating. The plating layer is made of metal which is highly resistant to corrosion and affords high connectability to the connecting member 3, e.g. nickel, copper, gold, or silver. For example, the exposed surface is deposited successively with a nickel plating layer measuring about 0.5 μm to 5 μm in thickness and a gold plating layer measuring about 0.1 μm to 3 μm in thickness. This can retard corrosion of the metallic layer 14 effectively, and also can strengthen the connection between the metallic layer 14 and the connecting member 3.

Moreover, a metallic layer. such as copper (Cu) or gold (Au) may be placed on the barrier layer in the interest of successful formation of the plating layer. The above-described metallic layer is formed in a similar manner to that for forming the thin-film layer.

It is preferred to use an aluminum nitride sintered body which excels in thermal conductivity for the first substrate 1. The joining together of the first substrate 11 and the second substrate 12 is accomplished by bonding the outer surface of the second substrate 12 to the inner surface of the through hole 11a of the first substrate 11 via a joining material made of an active brazing filler metal, e.g. a Ti—Cu—Ag alloy or a Ti—Sn—Ag—Cu alloy. The joining together of the first substrate 11 and the third substrate 13 is accomplished by bonding the outer surface of the third substrate 13 to the inner surface of the through hole 11a of the first substrate 11 via a joining material made of an active brazing filler metal, e.g. a Ti—Cu—Ag alloy or a Ti—Sn—Ag—Cu alloy. The joining material, which is about 10 μm thick, is interposed between the first substrate 11 and the second substrate 12, or between the first substrate 11 and the third substrate 13.

In the plan view, the first substrate 11 is shaped in a quadrangular frame, and is provided with the through hole 11a for embedding the second substrate 12 and the third substrate 13. The second substrate 12 is quadrangular in plan configuration. The third substrate 13 is quadrangular in plan configuration. The first substrate 11, the second substrate 12, and the third substrate 13 are bonded together into a quadrangular composite substrate. As used herein the term "quadrangular configuration" means the shape of a quadrilateral such as a square and a rectangle. In the plan view, the first substrate 11 is shaped in a square frame, and, the second substrate 12 and the third substrate 13 each have a rectangular shape. Thus, the resulting composite substrate has a square form.

For example, a thickness T1 of the first substrate 11 T1 is about 100 μm to 2000 μm, and a thickness T2 of the second substrate 12 is about 100 μm to 2000 μm. For example, a thickness T3 of the third substrate 13 is about 100 μm to 2000 μm. That is, the thickness T1 of the first substrate 11 and the thickness T2 of the second substrate 12 are substantially equal ($0.9T1 \leq T2 \leq 1.1T1$). Also, the thickness T1 of the first substrate 11 and the thickness T3 of the third substrate 13 are substantially equal ($0.9T1 \leq T3 \leq 1.1T1$).

Following the production of the composite substrate including the first substrate 11, the second substrate 12, and the third substrate 13 joined together via the joining material, the metallic layer 14 is formed on the first principal face of the first substrate 11. Thus, the electronic element mounting substrate 1 is constructed.

In the planar direction of the first substrate 11, a thermal conductivity κ of the first substrate 11 in an x direction and a thermal conductivity κ thereof in a y direction are substantially uniform. Moreover, in the thickness direction of the first substrate 11, a thermal conductivity κ of the first substrate 11 in a z direction is approximately equal to the thermal conductivity κ in the planar direction, i.e. the x direction and the y direction (κx≈κy≈κz). For example, in the case where an aluminum nitride sintered body is used for the first substrate 11, the first substrate 11 is constructed of a substrate having a thermal conductivity κ of about 100 to 200 W/m·K.

In the planar direction of the second substrate 12, a thermal conductivity λ1 of the second substrate 12 in the x direction and a thermal conductivity λ1 thereof in the y direction differ in level from each other. That is, in the second substrate 12, the thermal conductivity λ1 in the x direction corresponding to the planar direction and the thermal conductivity λ in the z direction corresponding to the thickness direction are approximately equal, but the thermal conductivity λ in the y direction corresponding to the planar direction is different. The relationship among the thermal conductivities λ1 of the second substrate 12 in different directions, namely the relationship among λx1, λy1, and λz1 is expressed as: "thermal conductivity λx1≈thermal conductivity λz1>>thermal conductivity λy1". For example, the thermal conductivity λx1 and the thermal conductivity λz1 of the second substrate 12 are each about 1000 W/m·K, whereas the thermal conductivity λy1 of the second substrate 12 is about 4 W/m·K.

In the planar direction of the third substrate 13, a thermal conductivity λ2 of the third substrate 13 in the x direction and a thermal conductivity λ2 thereof in the y direction differ in level from each other. That is, in the third substrate 13, the thermal conductivity λ2 in the y direction corresponding to the planar direction and the thermal conductivity λ in the z direction corresponding to the thickness direction are approximately equal, but the thermal conductivity λ in the x direction corresponding to the planar direction is different. The relationship among the thermal conductivities λ2 of the third substrate 13 in different directions, namely the relationship among λx2, λy2, and λz2 is expressed as: "thermal conductivity λy2≈thermal conductivity λz2>>thermal conductivity λx2". For example, the thermal conductivity λy2 and the thermal conductivity λz2 of the third substrate 13 are each about 1000 W/m·K, whereas the thermal conductivity λx1 of the third substrate 13 is about 4 W/m·K. That is, the direction for the second substrate 12 to exhibit a higher (lower) thermal conductivity λ1 differs from the direction for the third substrate 13 to exhibit a higher (lower) thermal conductivity λ2. In some drawings for this embodiment, as well as in some drawings for embodiments that will hereinafter be described, one of the thermal conductivities κx, κy, κz, λx1, λy1, λz1, λx2, λy2, and λz2 may be omitted for the sake of convenience.

The electronic device can be produced by mounting the electronic element 2 on the mounting portion 1a of the second substrate 12 of the electronic element mounting substrate 1. It is also satisfactory to produce the electronic device by installing the electronic element mounting substrate 1 on which the electronic element 2 is mounted, in a wiring substrate or electronic element mounting package. Examples of the electronic element 2 mounted on the electronic element mounting substrate 1 include light-emitting elements such as LD (Laser Diode) and LED (Light Emitting Diode) and light-receiving elements such as PD (Photo Diode). For example, the electronic element 2 is fixedly disposed on the mounting portion 1a of the second substrate 12 via a joining material such as a Au—Sn material. After that, an electrode of the electronic element 2 is electrically connected to the metallic layer 14 via the connecting member 3 such as a bonding wire. Thus, the mounting of the electronic element 2 on the electronic element mounting substrate 1 is accomplished. If using a wiring substrate or electronic element mounting package in which the electronic element mounting substrate 1 is installed, the wiring substrate or electronic element mounting package may be, like the first substrate 11, constructed of an insulating base body made of ceramics or the like including a wiring conductor on a surface thereof. Moreover, if using a wiring substrate or electronic element mounting package in which the electronic element mounting substrate 1 is installed, the metallic layer 14 of the electronic element mounting substrate 1 is electrically connected to the wiring conductor of the wiring substrate or electronic element mounting package.

The electronic element mounting substrate 1 according to this embodiment includes: the first substrate 11 including the first principal face and the second principal face located opposite to the first principal face; the second substrate 12 located inside the first substrate 11 in the plan view, the second substrate 12 including the third principal face located on the first principal face side in the thickness direction and the fourth principal face located opposite to the third principal face, the second substrate 12 being made of a carbon material; the third substrate 13 located between the first substrate 11 and the second substrate 12 in the plan view, the third substrate 13 including the fifth principal face located on the first principal face side in the thickness direction and the sixth principal face located opposite to the fifth principal face, third substrate 13 being made of a carbon material; and the mounting portion 1a for mounting the electronic element 2, the mounting portion 1a being located on the first principal face side in the thickness direction. The second substrate 12 and the third substrate 13 each have the low heat conduction direction and the high heat conduction direction. The second substrate 12 and the third substrate 13 are arranged so that the low heat conduction directions of the second substrate 12 and the third substrate 13 are perpendicular to each other (λy1 direction 1 λx2 direction) and also the high heat conduction directions of the second substrate 12 and the third substrate 13 are perpendicular to each other (λx1 direction 1 λy2 direction). With this arrangement, during the operation of the electronic element 2 mounted on the mounting portion 1a, in the plan view, heat from the electronic element 2 is distributively transmitted in different directions, namely the direction for the second substrate 12 to exhibit higher thermal conductivity (λx1 direction) and the direction for the third substrate 13 to exhibit higher thermal conductivity (λy2 direction). This makes it possible to impart high heat-conducting capability and high reliability to the electronic element mounting substrate 1.

Moreover, the third substrate 13 has a quadrangular shape, and, in the plan view, heat conduction of the second substrate 12 is higher in a direction perpendicular to the longitudinal direction of the third substrate 13 than in the longitudinal direction of the third substrate 13, and heat conduction of the third substrate 13 is higher in the longitudinal direction thereof than in a direction perpendicular to the longitudinal direction. This can facilitate, during the operation of the electronic element 2 mounted on the second substrate 12, transmission of heat to the third substrate while restraining heat transmission to a region opposed to the side of the second substrate 12, and also restraining heat transmission in a direction perpendicular to the direction in which the second substrate 12 is disposed adjacent to the third substrate 13. The heat transmitted to the third substrate 13 side can be smoothly transmitted along the outer edge of the second substrate 12 in the direction perpendicular to the direction in which the second substrate 12 is disposed adjacent to the third substrate 13. Thus, in the plan view, the heat propagating in the direction in which the second substrate 12 is disposed adjacent to the third substrate 13 can be smoothly transmitted to a predetermined surrounding region opposed to the second substrate 12, and can be then smoothly transmitted to a predetermined region (e.g. a portion for external heat dissipation). Consequently, the electronic element mounting substrate 1 can become highly reliable.

Moreover, as illustrated in FIGS. 5A to 9 which will hereafter be referred to, preferably, in the plan view, the third substrates 13 are arranged with the second substrate 12 in between. In this case, during the operation of the electronic element 2 mounted on the second substrate 12 and the third substrate 13, heat liberated by the electronic element 2 on the third substrate 13 can be smoothly transmitted in a direction perpendicular to the direction in which the third substrates 13 are arranged with the second substrate 12 in between rather than in the direction in which the two opposed sides of the electronic element 2 are located with the second substrate 12 in between. This makes it possible to restrain heat against propagation from the outer edge of the electronic element 2 situated on the third substrate 13 to the central area of the electronic element 2, and thereby operate the electronic element 2 effectively for long periods with little deterioration in performance.

The second substrate 12 exhibits higher thermal conductivity in the direction of its thickness than in the longitudinal direction of the third substrate 13, whereas the third substrate 13 exhibits higher thermal conductivity in the longitudinal direction thereof than in a direction perpendicular to the longitudinal direction. The second substrate 12 and the third substrate 13 include mutually opposing faces. During the operation of the electronic element 2 mounted on the second substrate 12, even if heat is transmitted through the entire area of the face of the second substrate 12 opposed to the face of the third substrate 13, the heat can be smoothly transmitted along the outer edge of the second substrate 12 in a direction perpendicular to the direction in which the second substrate 12 is disposed adjacent to the third substrate 13. Thus, in the plan view, the heat propagating in the direction in which the second substrate 12 is disposed adjacent to the third substrate 13 can be smoothly transmitted to a predetermined surrounding region opposed to the second substrate 12, and can be then smoothly transmitted to a predetermined region (e.g. a portion for external heat dissipation). Consequently, the electronic element mounting substrate 1 can become highly reliable.

Moreover, in the case where a light-emitting element is used as the electronic element 2, the electronic element mounting substrate 1 is capable of proper dissipation of heat from the light-emitting element mounted on the mounting portion 1a located on the first principal face side, ensuring satisfactory light emission from the light-emitting element.

The electronic device according to this embodiment includes the electronic element mounting substrate 1 mentioned above and the electronic element 2 mounted on the mounting portion 1a of the electronic element mounting substrate 1. Thus constructed, the electronic device can remain reliable for long periods.

The electronic device according to this embodiment is connected, at the metallic layer 14 of the electronic element mounting substrate 1 thereof, to the connection pad of the module substrate via a joining material such as solder, thereby constituting the electronic module. Thus, the electronic element 2 and the connection pad of the module substrate are electrically connected to each other.

Moreover, in the case where the electronic device includes a wiring substrate or electronic element housing package in which the electronic element mounting substrate 1 is installed, the electronic device is connected, at the wiring conductor of the wiring substrate or electronic element housing package thereof, to the connection pad of the module substrate via a joining material such as solder, thereby constituting the electronic module. Thus, the electronic element 2 and the connection pad of the module substrate are electrically connected to each other.

The electronic module according to this embodiment includes the electronic device mentioned above and the module substrate to which the electronic device is connected. Thus constructed, the electronic module can remain reliable for long periods.

While the metallic layer 14 disposed on the first principal face of the first substrate 11 is, as exemplified, formed by using a thin-film method, the metallic layer 14 may be formed by using heretofore known co-firing or post-firing.

Second Embodiment

The following describes an electronic device according to a second embodiment of the disclosure with reference to FIGS. 5A to 9 and FIGS. 1A to 4 as well.

In the electronic element mounting substrate 1 according to the second embodiment of the disclosure, in the plan view, the third substrate 13 extends more than the second substrate 12 in the longitudinal direction of the third substrate 13. This design holds true for the embodiment shown in FIGS. 1A to 4.

In FIG. 6, in the illustrated first substrate 1, the outer surface of the first substrate 11 and the inner surface of the through hole 11a of the first substrate 11, which become invisible as viewed in perspective, are indicated by dotted lines. In FIGS. 5A, 5B, 6, and 8, the illustrated second substrate 12 and third substrate 13 are each indicated by a dot-shaded area.

Moreover, the third substrate 13 has a quadrangular shape, and, in the plan view, the third substrate 13 extends more than the second substrate 12 in the longitudinal direction of the third substrate 13. In this case, heat transmitted from the second substrate 12 to the third substrate 13 can be transmitted more smoothly toward the outside of the electronic element mounting substrate 1, and also heat propagating in the vicinity of the corners of the second substrate 12 contacted by the third substrate 13 can be smoothly transmitted, through the third substrate 13, to a predetermined region. This makes it possible to render the electronic element mounting substrate 1 highly reliable. Note that the third substrate 13 may be configured so that its ends extend beyond the ends of the second substrate 12 in the longitudinal direction of the third substrate 13, and more specifically, that one of the ends of the third substrate 13 which points in a positive direction along an imaginary y axis or that one of the ends thereof which points in a negative direction along the imaginary y axis extends beyond the corresponding end of the second substrate 12 in the longitudinal direction of the third substrate 13.

The second substrate 12 exhibits higher thermal conductivity in the thickness direction thereof than in the longitudinal direction of the third substrate 13, whereas the third substrate 13 exhibits higher thermal conductivity in the longitudinal direction thereof than in a direction perpendicular to the longitudinal direction. The second substrate 12 and the third substrate 13 includes mutually opposing faces. During the operation of the electronic element 2 mounted on the second substrate 12, even if heat is transmitted through the entire area of the face of the second substrate 12 opposed to the face of the third substrate 13, the heat can be smoothly transmitted along the outer edge of the second substrate 12 in a direction perpendicular to the direction in which the second substrate 12 is disposed adjacent to the third substrate 13. Thus, in the plan view, the heat propagating in the direction in which the second substrate 12 is disposed adjacent to the third substrate 13 can be smoothly transmitted to a predetermined surrounding region opposed to the second substrate 12, and can be then smoothly transmitted to a predetermined region (e.g. a portion for external heat dissipation). Consequently, the electronic element mounting substrate 1 can become highly reliable.

Moreover, in the case where a light-emitting element is used as the electronic element 2, the electronic element mounting substrate 1 is capable of proper dissipation of heat from the light-emitting element mounted on the mounting portion 1a of the second substrate 12, ensuring satisfactory light emission from the light-emitting element.

In the plan view, the first substrate 11 is shaped in a quadrangular frame, and is provided with the through hole 11a for embedding the second substrate 12 and the third substrate 13. The second substrate 12 is quadrangular in plan configuration. The third substrate 13 is quadrangular in plan configuration. The third substrate 13 extends more than the second substrate 12 in the longitudinal direction of the third substrate 13. That is, a length L2 of the third substrate 13 is greater than a length L1 of the second substrate 12 (L2>L1). The first substrate 11, the second substrate 12, and the third substrate 13 are bonded together into a quadrangular composite substrate. In the plan view, the first substrate 11 is shaped in a square frame, and the second substrate 12 and the third substrate 13 each have a rectangular shape. Thus, the resulting composite substrate has a square form.

Moreover, preferably, the length L2 of the third substrate 13 in the longitudinal direction thereof is greater than a length L3 of a region where a plurality of metallic layers 14, etc. are arranged along the longitudinal direction of the third substrate 13 (L2>L3). In this case, the heat transmitted from the second substrate 12 to the third substrate 13 is transmitted to the outside region beyond the region of the arrangement of the metallic layers 14, etc. This can facilitate transmission of heat to a predetermined region through the third substrate 13 while restraining heat transmission toward the region of the arrangement of a plurality of the metallic layers 14, etc. Consequently, the electronic element mounting substrate 1 can become highly reliable.

Moreover, preferably, each area of the third substrate 13 which protrudes in the longitudinal direction thereof protrudes outward beyond corresponding one of the ends of the region where the plurality of metallic layers 14, etc. are arranged near the second substrate 12. This can facilitate transmission of heat to a predetermined region through the third substrate 13 while restraining heat transmission toward the region of the arrangement of a plurality of the metallic layers 14, etc. Consequently, the electronic element mounting substrate 1 can become highly reliable.

Otherwise, the electronic element mounting substrate 1 according to the second embodiment can be manufactured by a similar method to the method of manufacturing the electronic element mounting substrate 1 according to the preceding embodiment.

Third Embodiment

The following describes an electronic device according to a third embodiment of the disclosure with reference to FIGS. 10A to 12B.

The electronic element mounting substrate 1 according to the third embodiment of the disclosure differs from the electronic element mounting substrate 1 according to the preceding embodiment in that it includes a second mounting portion 1b for mounting a second electronic element 3, the second mounting portion 1b being located on a second principal face side in the thickness direction, and that, in the plan view, heat conduction of the second substrate 12 is higher in the planar direction thereof than in the thickness direction thereof.

In the electronic element mounting substrate 1 according to the third embodiment, in the plan view, the third substrate 13 built in the form of a frame is disposed between the first substrate 11 and the second substrate 12. The third substrate 13 in frame form surrounds the second substrate 12.

In the electronic element mounting substrate 1 according to the third embodiment, two third substrates 13 arranged facing each other in an imaginary x-axis direction (indicated by light shaded areas in FIGS. 10A to 11) have a thermal conductivity $\lambda 2$, whereas two other third substrates 13 arranged facing each other in an imaginary y-axis direction (indicated by dark shaded areas in FIGS. 10A to 11) have a thermal conductivity $\lambda 3$. There are differences in the direction for the second substrate 12 to exhibit a higher (lower) thermal conductivity $\lambda 1$, the direction for the third substrate 13 to exhibit a higher (lower) thermal conductivity $\lambda 2$, and the direction for the other third substrate 13 to exhibit a higher (lower) thermal conductivity $\lambda 3$.

In the planar direction of the third substrate 13, the thermal conductivity $\lambda 3$ of the third substrate 13 in the x direction and the thermal conductivity $\lambda 3$ thereof in the y direction differ in level from each other. The relationship among the thermal conductivities $\lambda 3$ of the third substrate 13 in different directions, namely the relationship among $\lambda x3$, $\lambda y3$, and $\lambda z3$ is expressed as: "thermal conductivity $\lambda x3 \approx$ thermal conductivity $\lambda z3 \gg$ thermal conductivity $\lambda y2$". That is, in the third substrate 13, the thermal conductivity $\lambda 3$ in the x direction corresponding to the planar direction and the thermal conductivity $\lambda 3$ in the z direction corresponding to the thickness direction are approximately equal, but the thermal conductivity $\lambda 3$ in the y direction corresponding to the planar direction is different. For example, the thermal conductivity $\lambda x3$ and the thermal conductivity $\lambda z3$ of the third substrate 13 are each about 1000 W/m·K, whereas the thermal conductivity $\lambda y3$ of the third substrate 13 is about 4 W/m·K. In some drawings for this embodiment, as well as in some drawings for embodiments that will hereinafter be described, one of the thermal conductivities $\lambda x3$, $\lambda y3$, and $\lambda z3$ may be omitted for the sake of convenience.

In this construction, the second mounting portion 1b for mounting the second electronic element is located on the second principal face side in the thickness direction, and heat conduction of the second substrate 12 is higher in the planar direction than in the thickness direction. Thus, during the operation of the first electronic element 2 mounted on the first mounting portion 1a and the second electronic element mounted on the second mounting portion 1b, heat liberated by the first electronic element 2 and heat liberated by the second electronic element are each transmitted smoothly in the planar direction from corresponding one of the first mounting portion 1a and the second mounting portion 1b located opposite each other toward the outer periphery of corresponding one of the first mounting portion 1a and the second mounting portion 1b. This makes it possible to reduce accumulation of heat at each of the first mounting portion 1a and the second mounting portion 1b, and thereby prevent impairment of the operational capability of the first electronic element 2 mounted on the first mounting portion 1a and the second electronic element mounted on the second mounting portion 1b, ensuring good performance of the first electronic element 2 and the second electronic element.

Moreover, the third substrate 13 is preferably configured so that the thermal conductivity in the extension direction of the side of the second substrate 12 is greater than the thermal conductivity in a direction perpendicular to the extension direction of the side of the second substrate 12. In this case, heat transmitted to the outer edge side of the second substrate 12 is smoothly dissipated while undergoing diffusion in the extension direction of the side of the second substrate 12, as well as in the thickness direction of the third substrate 13. Thus, during the operation of the first electronic element 2 mounted on the first mounting portion 1a and the second electronic element mounted on the second mounting portion 1b, heat can be properly released to the outside, in consequence whereof there results no impairment of the operational capability of the first electronic element 2 mounted on the first mounting portion 1a and the second electronic element mounted on the second mounting portion 1b. This can ensure good performance of the first electronic element 2 and the second electronic element. The third substrate 13 may be shaped in a frame. In this case, in the plan view, the third substrate 13 surrounds the second substrate 12. Moreover, for example, four quadrangular third substrates 13 may be arranged in the form of a frame so as to surround the second substrate 12 in the plan view.

Otherwise, the electronic element mounting substrate 1 according to the third embodiment can be manufactured by a similar method to the method of manufacturing the electronic element mounting substrate 1 according to the preceding embodiment.

Fourth Embodiment

The following describes an electronic device according to a fourth embodiment of the disclosure with reference to FIGS. 13A to 17B.

The electronic element mounting substrate 1 according to the fourth embodiment of the disclosure differs from the electronic element mounting substrate 1 according to the preceding embodiment in that the second substrates 12 and the third substrates 13 are arranged in a staggered format in the planar direction. Two second substrates 12 and two third substrates 13, or a total of four substrates are arranged in a 2- by 2-substrate matrix inside the first substrate 11.

With the staggered arrangement of the second and third substrates 12 and 13 in the planar direction, during the operation of the electronic element 2 mounted on the mounting portion 1a, in the plan view, heat from the electronic element 2 can be distributively transmitted in different directions, namely the direction for the second substrate 12 to exhibit higher thermal conductivity (λx1 direction) and the direction for the third substrate 13 to exhibit higher thermal conductivity (λy2 direction). This makes it possible to impart high heat-conducting capability and high reliability to the electronic element mounting substrate 1.

Moreover, in the plan view, the mounting portion 1a is located so as to straddle the boundary between the second substrate 12 and the third substrate 13. In this case, during the operation of the electronic element 2 mounted on the mounting portion 1a, in the plan view, heat from the electronic element 2 can be distributively transmitted in different directions, namely the direction for the second substrate 12 to exhibit higher thermal conductivity (λx1 direction) and the direction for the third substrate 13 to exhibit higher thermal conductivity (λy2 direction). This makes it possible to impart high heat-conducting capability and high reliability to the electronic element mounting substrate 1.

Otherwise, the electronic element mounting substrate 1 according to the fourth embodiment can be manufactured by a similar method to the method of manufacturing the electronic element mounting substrate 1 according to the preceding embodiment.

Fifth Embodiment

The following describes an electronic device according to a fifth embodiment of the disclosure with reference to FIGS. 18A to 22.

The electronic element mounting substrate 1 according to the fifth embodiment of the disclosure differs from the electronic element mounting substrate 1 according to the preceding embodiment in that it includes a fourth substrate 15 and a fifth substrate 16. The fourth substrate 15 is disposed on the first principal face of the first substrate 11, and includes a seventh principal face (lower surface as viewed in FIGS. 18A to 22) opposed to the first principal face, and an eighth principal face (upper surface as viewed in FIGS. 18A to 22) located opposite to the seventh principal face. The fifth substrate 16 is disposed on the second principal face of the first substrate 11, and includes a ninth principal face (upper surface as viewed in FIGS. 18A to 22) opposed to the second principal face, and a tenth principal face (lower surface as viewed in FIGS. 18A to 22) located opposite to the ninth principal face.

Figure 19:
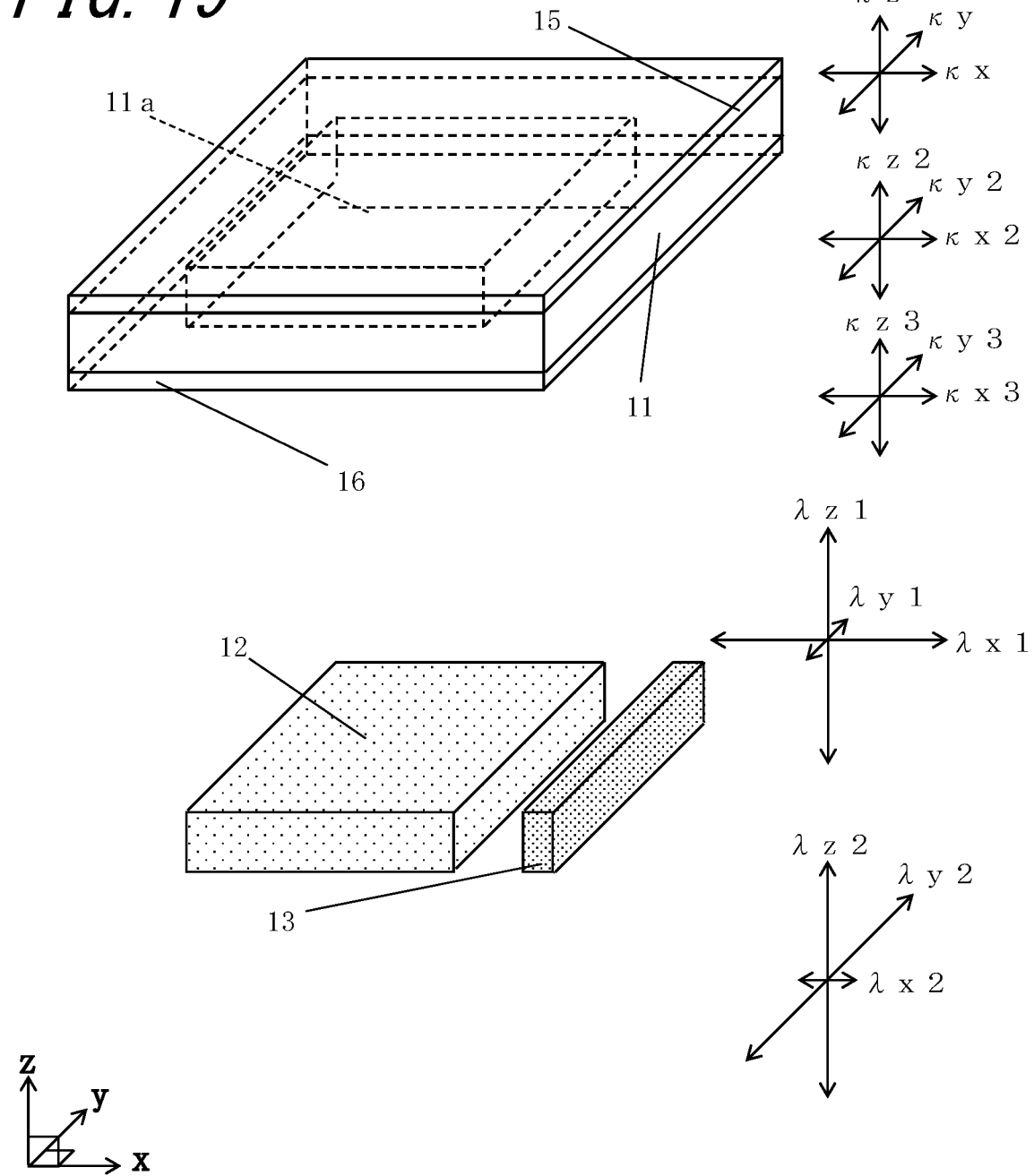
FIG. 19 is an exploded perspective view showing a first substrate, a fourth substrate, a fifth substrate, a second substrate, and a third substrate of the electronic element mounting substrate shown in FIGS. 18A and 18B in a disassembled state.
Figure 20:
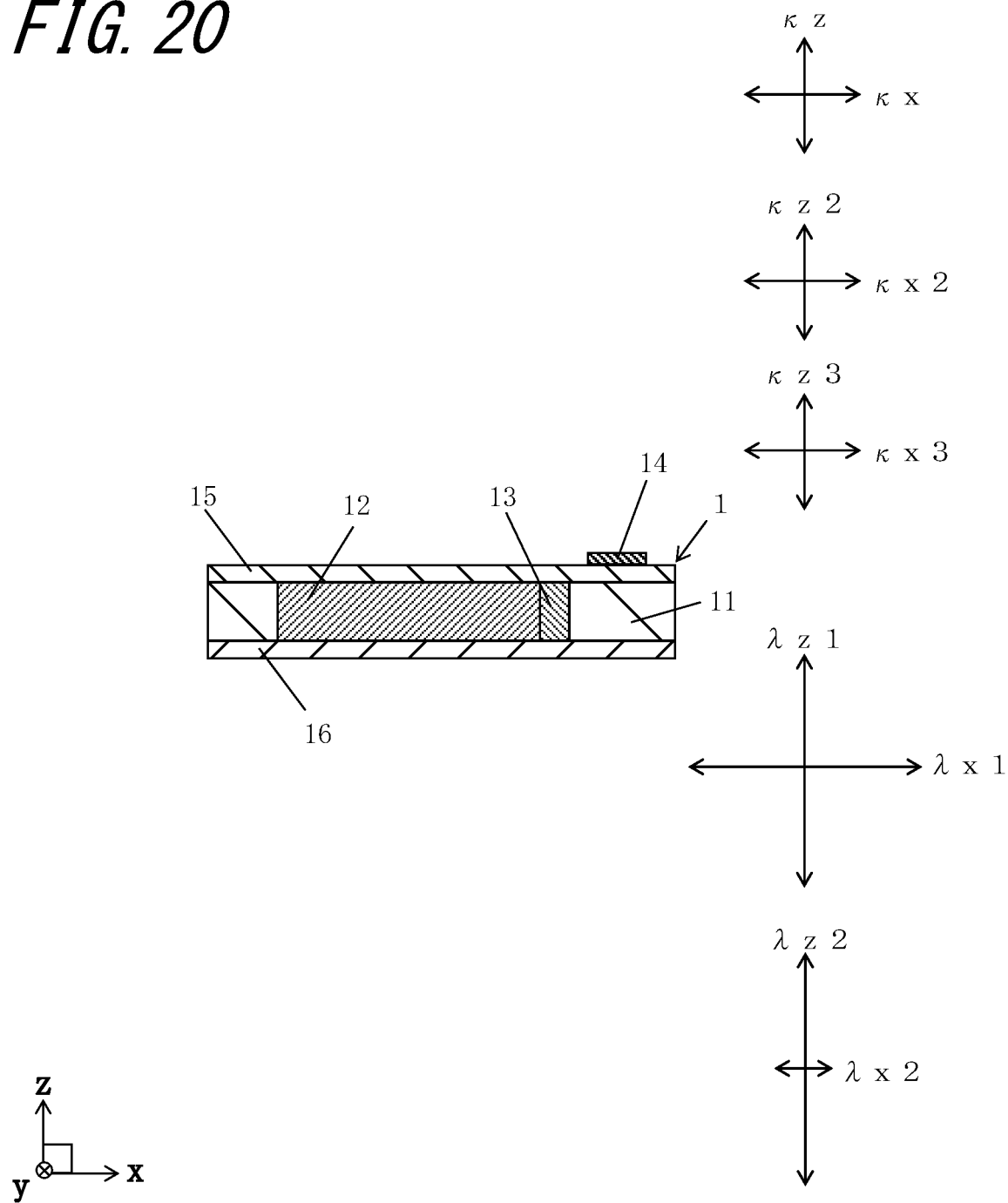
FIG. 20 is a vertical sectional view of the electronic element mounting substrate taken along the line A-A shown in FIG. 18A.
Figure 22:
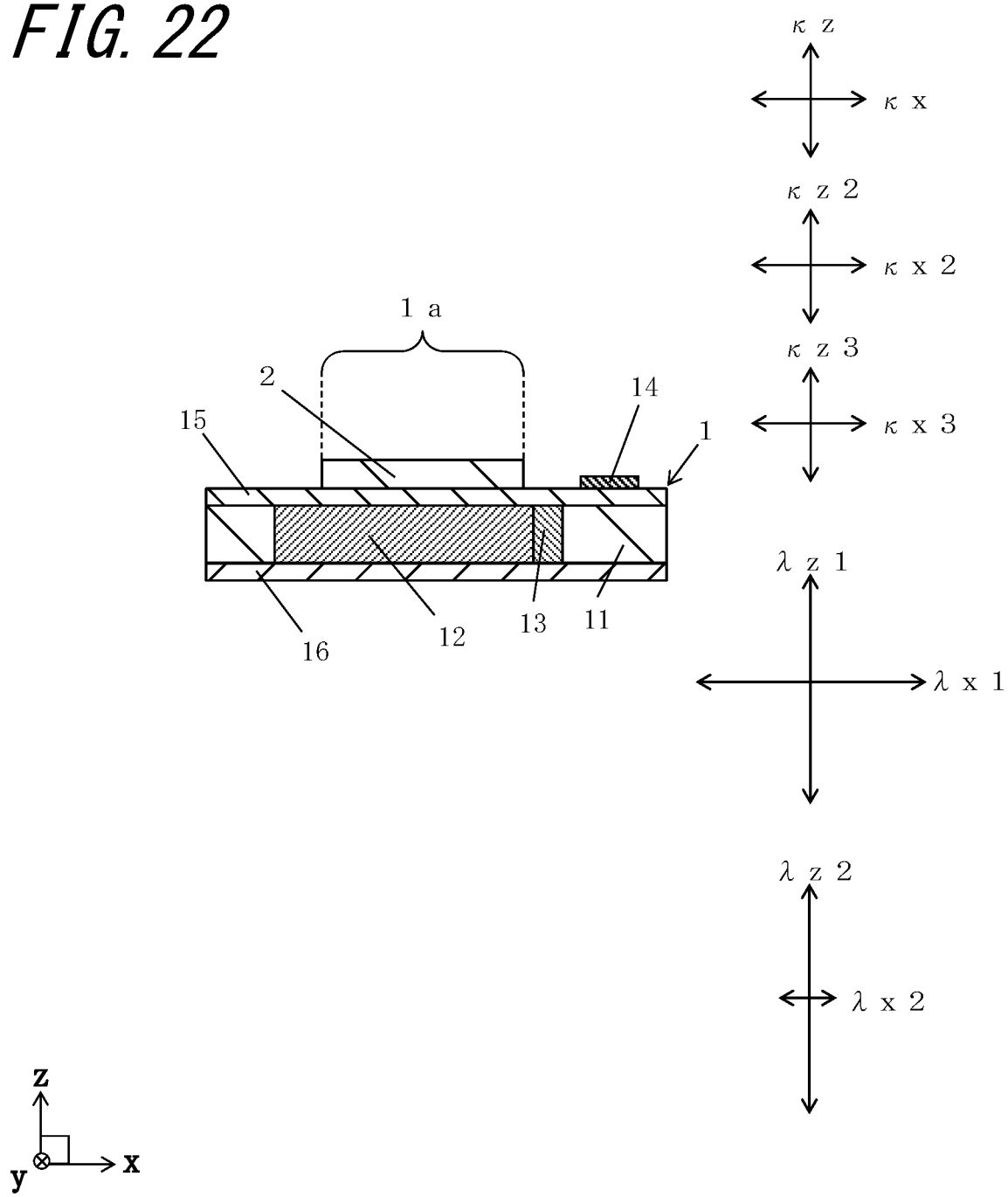
FIG. 22 is a vertical sectional view of the electronic device taken along the line A-A shown in FIG. 21.

In FIG. 19, in the illustrated first substrate 11, fourth substrate 15, and fifth substrate 16, the outer surface of the first substrate 11, the outer surface of the fourth substrate 15, the outer surface of the fifth substrate 16, and the inner surface of the through hole 11a of the first substrate 11, which become invisible as viewed in perspective, are indicated by dotted lines. In FIG. 19, the illustrated second substrate 12 and third substrate 13 are each indicated by a dot-shaded area.

For example, the fourth substrate 15 and the fifth substrate 16 may be made of ceramics such as an aluminum oxide sintered body (alumina ceramics), an aluminum nitride sintered body, a mullite sintered body, and a glass ceramics sintered body. The fourth substrate 15 and the fifth substrate 16 may be produced by using the same material and method as those used for the production of the first substrate 11 made of ceramics as described above.

It is preferred to use an aluminum nitride sintered body which excels in thermal conductivity for the fourth substrate 15 and the fifth substrate 16. In the case where the first substrate 11 is made of an aluminum nitride sintered body, an aluminum nitride sintered body may be used for the fourth substrate 15 and the fifth substrate 16. The eighth principal face of the fourth substrate 15 is bonded with the first principal face of the first substrate 11, the third principal face of the second substrate 12, and the fifth principal face of the third substrate 13, via a joining material made of an active brazing filler metal, e.g. a Ti—Cu—Ag alloy or a Ti—Sn—Ag—Cu alloy. The ninth principal face of the fifth substrate 16 is bonded with the second principal face of the first substrate 11, the fourth principal face of the second substrate 12, and the sixth principal face of the third substrate 13, via a joining material made of an active brazing filler metal, e.g. a Ti—Cu—Ag alloy or a Ti—Sn—Ag—Cu alloy. The joining material, which is about 10 μm thick, is interposed between the fourth substrate 15 and each of the first substrate 11, the second substrate 12, and the third substrate 13, or between the fifth substrate 16 and each of the first substrate 11, the second substrate 12, and the third substrate 13.

In the planar direction of the fourth substrate 15, a thermal conductivity κ2 of the fourth substrate 15 in the x direction and a thermal conductivity κ2 thereof in the y direction are substantially uniform. Moreover, in the thickness direction of the fourth substrate 15, a thermal conductivity κ2 of the fourth substrate 15 in the z direction is approximately equal to the thermal conductivity κ2 in the planar direction, i.e. the x direction and the y direction (κx2≈κy2≈κz2). For example, where sintered aluminum nitride is used for the fourth substrate 15, the fourth substrate 15 is constructed of a substrate having a thermal conductivity κ2 of about 100 to 200 W/m·K.

In the planar direction of the fifth substrate 16, a thermal conductivity κ3 of the fifth substrate 16 in the x direction and a thermal conductivity κ3 thereof in the y direction are substantially uniform. Moreover, in the thickness direction of the fifth substrate 16, a thermal conductivity κ3 of the fifth substrate 16 in the z direction is approximately equal to the thermal conductivity κ3 in the planar direction, i.e. the x direction and the y direction (κx3≈κy3≈κz3). For example, in the case where an aluminum nitride sintered body is used for the fifth substrate 16, the fifth substrate 16 is constructed of a substrate having a thermal conductivity κ3 of about 100 to 200 W/m K. In some drawings for this embodiment, one of the thermal conductivities κx2, κy2, κz2, κx3, κy3, and κz3 may be omitted for the sake of convenience.

Moreover, in the electronic element mounting substrate 1 according to the fifth embodiment, a metal material, e.g. copper (Cu), copper-tungsten (Cu—W), and copper-molybdenum (Cu—Mo) may be used for the first substrate 11. For example, where the first substrate 11 is made of copper, the first substrate 11 is constructed of a substrate having a thermal conductivity κ of about 400 W/m·K.

For example, a thickness T4 of the fourth substrate 15 is about 50 μm to 500 μm. Preferably, the second substrate 12 and the fourth substrate 15 fulfill the relationship in thickness given by: T2>T4, and also the third substrate 13 and the fourth substrate 15 fulfill the relationship in thickness given by: T3>T4. This permits satisfactory dissipation of heat from the electronic element 2 to the second substrate 12 and the third substrate 13 through the fourth substrate 15.

Moreover, a thickness T5 of the fifth substrate 16, like the thickness T1 of the first substrate 11, falls in the range of about 50 μm to 500 μm. Preferably, the thickness T4 of the fourth substrate 15 and the thickness T5 of the fifth substrate 16 are substantially equal, with an allowable margin between them limited to about 10% (0.90T5≤T4≤1.10T5). This makes it possible to restrain the electronic element mounting substrate 1 against warpage more effectively, and thereby facilitate satisfactory light emission. For example, in the case where the thickness of the fourth substrate 15 is set at 100 μm, the thickness of the fifth substrate 16 is preferably set at 100 μm (within the range of 90 μm to 110 μm).

In the plan view, the first substrate 11 is shaped in a quadrangular frame, and is provided with the through hole 11a for embedding the second substrate 12 and the third substrate 13. The second substrate 12 is quadrangular in plan configuration. The third substrate 13 is quadrangular in plan configuration. The fourth substrate 15 is quadrangular in plan configuration. The fifth substrate 16 is quadrangular in plan configuration. The first substrate 11, the second substrate 12, the third substrate 13, the fourth substrate 15, and the fifth substrate 16 are bonded together into a quadrangular composite substrate. In the plan view, the first substrate 11 is shaped in a square frame, and the second substrate 12 and the third substrate 13 each have a rectangular shape, and the fourth substrate 15 and the fifth substrate 16 each have a square shape. Thus, the resulting composite substrate has a square form.

Moreover, in the electronic element mounting substrate 1 according to the fifth embodiment, the fifth substrate 16 may be shaped in a frame.

Moreover, the fourth substrate 15 may differ between its thickness T4 in the part located on the center side of the electronic element mounting substrate 1 and its thickness T4 in the part located on the outer periphery side of the electronic element mounting substrate 1. That is, in the plan view, a part of the fourth substrate 15 which overlaps with the second substrate 12 and a part of the fourth substrate 15 which overlaps with the first substrate 11 may differ in thickness from each other. Preferably, the fourth substrate 15 is thicker at the part thereof which overlaps with the second substrate 12 than at the part thereof which overlaps with the first substrate 11. This can facilitate more satisfactory dissipation of heat from the electronic element 2 mounted on the fourth substrate 15 toward the second substrate 12.

Also, the fifth substrate 16 may differ between its thickness T5 in the part located on the center side of the electronic element mounting substrate 1 and its thickness T5 in the part located on the outer periphery side of the electronic element mounting substrate 1. That is, in the plan view, a part of the fifth substrate 16 which overlaps with the second substrate 12 and a part of the fifth substrate 16 which overlaps with the first substrate 11 may differ in thickness from each other.

Otherwise, the electronic element mounting substrate 1 according to the fifth embodiment can be manufactured by a similar method to the method of manufacturing the electronic element mounting substrate 1 according to the preceding embodiment.

The disclosure is not limited to the embodiments described heretofore, and thus various changes and modifications may be made therein. For example, each of the electronic element mounting substrates 1 according to the first to fifth embodiments may be made in the form of a quadrangular composite substrate having beveled or chamfered corners.

Moreover, the electronic element mounting substrate 1 according to the disclosure may be implemented via a combination of the designs of some of the electronic element mounting substrates 1 according to the first to fifth embodiments. That is, for example, like the electronic element mounting substrate 1 according to the fifth embodiment, each of the electronic element mounting substrate 1 according to the second embodiment, the electronic element mounting substrate 1 according to the third embodiment, and the electronic element mounting substrate 1 according to the fourth embodiment may be provided with the fourth substrate 15 and the fifth substrate 16.

Moreover, in the electronic element mounting substrates 1 according to the first and second and fourth and fifth embodiments, the third substrate 13 may be located between the first substrate 11 and the second substrate 12 at the three sides of the second substrate 12.

Moreover, a mounting layer for the electronic element 2 may be disposed on the mounting portion 1a. The above-described mounting layer may be produced by using the same material and method as those used for the production of the metallic layer 14.

Moreover, the surfaces of the second substrate 12 and the third substrate 13 may be provided with, for example, a metallic plating layer including a Au plating layer located outermost.

The invention claimed is:

1. An electronic element mounting substrate, comprising:
a first substrate comprising a first face and a second face opposite to the first face;
a second substrate comprising a third face and a fourth face opposite to the third face, the second substrate being made of a carbon material;
a third substrate comprising a fifth face and a sixth face opposite to the fifth face, the third substrate being made of a carbon material; and
a first mounting portion for mounting a first electronic element; wherein,
the first mounting portion overlaps the third face in a plan view of the electronic element mounting substrate,
the second substrate is located inside the first substrate in the plan view of the electronic element mounting substrate,
the third substrate is located between the first substrate and the second substrate in the plan view of the electronic element mounting substrate,
the second substrate and the third substrate each have a low heat conduction direction in which heat conduction is low, and a high heat conduction direction in which the heat conduction is high,
the second substrate and the third substrate are arranged so that the low heat conduction direction of the second substrate and the low heat conduction direction of the third substrate are perpendicular to each other, and the high heat conduction direction of the second substrate and the high heat conduction direction of the third substrate are perpendicular to each other,
wherein the third substrate has a quadrangular shape, and
in the plan view of the electronic element mounting substrate, the heat conduction of the second substrate is higher in a direction perpendicular to a longitudinal direction of the third substrate than in a direction longitudinal to the longitudinal direction of the third substrate, and the heat conduction of the third substrate is higher in the longitudinal direction of the third substrate than in the direction perpendicular to the longitudinal direction of the third substrate, and
wherein, the third substrate comprises one third substrate and another third substrate in the plan view of the electronic element mounting substrate, and the second substrate is arranged between the one third substrate and the other third substrate.

2. The electronic element mounting substrate according to claim 1,
wherein, in the plan view of the electronic element mounting substrate, the third substrate extends more than the second substrate in the longitudinal direction of the third substrate.

3. The electronic element mounting substrate according to claim 1, further comprising:
a second mounting portion for mounting a second electronic element,
wherein the second mounting portion overlaps with the fourth face in the plan view of the electronic element mounting substrate, and
in the plan view of the electronic element mounting substrate, heat conduction of the second substrate is higher in a planar direction thereof than in a thickness direction thereof.

4. The electronic element mounting substrate according to claim 3,
wherein the third substrate is configured so that a thermal conductivity in a direction along a side of the second substrate is greater than a thermal conductivity in a direction perpendicular to the direction along the side of the second substrate.

5. The electronic element mounting substrate according to claim 1,
wherein the second substrate comprises a plurality of second substrates and the third substrate comprises a plurality of third substrates, and the plurality of second substrates and the plurality of third substrates are arranged in a staggered format in a planar direction of the electronic element mounting substrate.

6. The electronic element mounting substrate according to claim 5,
wherein, in the plan view of the electronic element mounting substrate, the first mounting portion is located so as to straddle a boundary between the second substrate and the third substrate.

7. The electronic element mounting substrate according to claim 1, further comprising:
a fourth substrate comprising a seventh face, and an eighth face opposite to the seventh face; and
a fifth substrate comprising a ninth face, and a tenth face opposite to the ninth face,
wherein the fourth substrate is arranged so that the seventh face is opposed to the first face, and
the fifth substrate is arranged so that the ninth face is opposed to the second face.

8. An electronic device, comprising:
the electronic element mounting substrate according to claim 1; and
a first electronic element which is mounted on the first mounting portion of the electronic element mounting substrate.

9. An electronic device, comprising:
the electronic element mounting substrate according to claim 3; and
a second electronic element which is mounted on the second mounting portion of the electronic element mounting substrate.

10. The electronic device according to claim 8, comprising:
a wiring board or electronic element housing package in which the electronic element mounting substrate is installed.

11. An electronic module, comprising:
the electronic device according to claim 8; and
a module substrate to which the electronic device is connected.

12. The electronic element mounting substrate according to claim 1,
wherein, in the plan view of the electronic element mounting substrate, the third substrate extends more than the second substrate in the longitudinal direction of the third substrate.

13. The electronic device according to claim 9, comprising:
a wiring board or electronic element housing package in which the electronic element mounting substrate is installed.

14. An electronic module, comprising:
the electronic device according to claim 9; and
a module substrate to which the electronic device is connected.

15. An electronic module, comprising:
the electronic device according to claim 10; and
a module substrate to which the electronic device is connected.

16. An electronic module, comprising:
the electronic device according to claim 13; and
a module substrate to which the electronic device is connected.

17. An electronic element mounting substrate, comprising:
a first substrate comprising a first face and a second face opposite to the first face;
a second substrate comprising a third face and a fourth face opposite to the third face, the second substrate being made of a carbon material;
a third substrate comprising a fifth face and a sixth face opposite to the fifth face, the third substrate being made of a carbon material; and
a first mounting portion for mounting a first electronic element; wherein,
the first mounting portion overlaps the third face in a plan view of the electronic element mounting substrate,
the second substrate is located inside the first substrate in the plan view of the electronic element mounting substrate,
the third substrate is located between the first substrate and the second substrate in the plan view of the electronic element mounting substrate,
the second substrate and the third substrate each have a low heat conduction direction in which heat conduction is low, and a high heat conduction direction in which the heat conduction is high,
the second substrate and the third substrate are arranged so that the low heat conduction direction of the second substrate and the low heat conduction direction of the third substrate are perpendicular to each other, and the high heat conduction direction of the second substrate and the high heat conduction direction of the third substrate are perpendicular to each other,
wherein the third substrate has a quadrangular shape, and in the plan view of the electronic element mounting substrate, the heat conduction of the second substrate is higher in a direction perpendicular to a longitudinal direction of the third substrate than in a direction longitudinal to the longitudinal direction of the third substrate, and the heat conduction of the third substrate is higher in the longitudinal direction of the third substrate than in the direction perpendicular to the longitudinal direction of the third substrate, and
wherein, in the plan view of the electronic element mounting substrate, the third substrate extends more than the second substrate in the longitudinal direction of the third substrate.

18. The electronic element mounting substrate according to claim 17,
wherein, the third substrate comprises one third substrate and another third substrate in the plan view of the electronic element mounting substrate, and the second substrate is arranged between the one third substrate and the other third substrate.

19. The electronic element mounting substrate according to claim 17, further comprising:
a second mounting portion for mounting a second electronic element,
wherein the second mounting portion overlaps with the fourth face in the plan view of the electronic element mounting substrate, and
in the plan view of the electronic element mounting substrate, heat conduction of the second substrate is higher in a planar direction thereof than in a thickness direction thereof.

20. The electronic element mounting substrate according to claim 19,
wherein the third substrate is configured so that a thermal conductivity in a direction along a side of the second substrate is greater than a thermal conductivity in a direction perpendicular to the direction along the side of the second substrate.

* * * * *